US012588531B2

(12) United States Patent
Tsuchiya et al.

(10) Patent No.: US 12,588,531 B2
(45) Date of Patent: Mar. 24, 2026

(54) SEMICONDUCTOR DEVICE

(71) Applicant: RENESAS ELECTRONICS CORPORATION, Tokyo (JP)

(72) Inventors: Keita Tsuchiya, Tokyo (JP); Tatsuaki Tsukuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 342 days.

(21) Appl. No.: 18/358,400

(22) Filed: Jul. 25, 2023

(65) Prior Publication Data

US 2024/0153854 A1 May 9, 2024

(30) Foreign Application Priority Data

Nov. 9, 2022 (JP) ................................. 2022-179420

(51) Int. Cl.
| | |
|---|---|
| *H01L 23/48* | (2006.01) |
| *H01L 23/00* | (2006.01) |
| *H01L 23/498* | (2006.01) |

(52) U.S. Cl.
CPC .. *H01L 23/49822* (2013.01); *H01L 23/49838* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 7,164,592 | B2 | 1/2007 | Yoshikawa et al. |
| 2007/0194433 | A1 | 8/2007 | Suwa et al. |
| 2020/0096923 | A1 | 3/2020 | Kawashima |
| 2022/0199506 | A1* | 6/2022 | Jeong ................ H01L 23/49822 |

FOREIGN PATENT DOCUMENTS

JP 2005-340247 A 12/2005

OTHER PUBLICATIONS

Office Action dated Nov. 13, 2025, issued in corresponding German Patent Application No. 102023131023.2.

* cited by examiner

Primary Examiner — Nicholas J Tobergte
(74) Attorney, Agent, or Firm — Rimon P.C.

(57) ABSTRACT

A semiconductor device includes a wiring substrate including a plurality of wiring layers, and a semiconductor chip including a first analog circuit. A power supply potential pattern capable of supplying a first power supply potential to the first analog circuit and a reference potential pattern capable of supplying a first reference potential to the first analog circuit are electrically connected with the first analog circuit. The power supply potential pattern is provided in a first wiring layer which is the nearest to a lower surface of the wiring substrate among the plurality of wiring layers. The reference potential pattern is provided in a second wiring layer which is the next nearest to the lower surface after the first wiring layer. The power supply potential pattern and the reference potential pattern extend in the same direction as each other while mutually overlapping with each other in transparent plan view.

17 Claims, 15 Drawing Sheets

SEMICONDUCTOR DEVICE

CROSS-REFERENCE TO RELATED APPLICATION

The disclosure of Japanese Patent Application No. 2022-179420 filed on Nov. 9, 2022, including the specification, drawings and abstract is incorporated herein by reference in its entirety.

BACKGROUND

The present disclosure relates to a semiconductor device. There is disclosed technique listed below.
[Patent Document 1] Japanese Unexamined Patent Application Publication No. 2005-340247
There is a semiconductor device in which a semiconductor chip is mounted on a wiring substrate including a plurality of wiring layers with a flip-chip connection method. For example, Patent Document 1 discloses, as countermeasure against crosstalk noise of digital signals in a wiring substrate, a structure in which a grand plane and a power plane ("plane" means a large-area conductor pattern) each functioning as a shield are arranged between a wiring layer arranging signal transmission terminals therein and a wiring layer arranging signal transmission wirings therein.

SUMMARY

A technique for reducing influence of a noise in a path configured to supply power to a circuit is needed along with higher functionality of a semiconductor device in order to stabilize an operation of the circuit in the semiconductor device. For example, an analog circuit such as phase locked loop (PLL) circuit may be provided in a semiconductor chip in a semiconductor device in order to stabilize a transmission quality of a digital signal. The noise is easier to influence the circuit operation in the analog circuit than a digital circuit, and thus a path configured to supply power to the analog circuit may be preferably shorter in path distance than other paths (such as a path configured to supply power to the digital circuit).

However, along with higher functionality of a semiconductor device, the number of external terminals in the semiconductor device tends to increase. An arrangement density of the external terminals tends to increase in order to downsize the semiconductor device. Consequently, some paths between an electrode of a semiconductor chip and the respective external terminal configured to supply power to an analog circuit may be longer in path distance. An electric power supplying path with the long path distance from the electrode of the semiconductor chip to the external terminal has a large inductance component in the electric power supplying path. Thus, a power supply potential or a reference potential flowing in this path easily changes due to the influence of noise.

Other problems and novel characteristics will be apparent from the description of the present specification and the drawings.

A semiconductor device according to one embodiment includes a wiring substrate including a plurality of wiring layers, and a semiconductor chip including a first analog circuit. A first power supply potential pattern capable of supplying a first power supply potential to the first analog circuit, and a first reference potential pattern capable of supplying a first reference potential to the first analog circuit are electrically connected with the first analog circuit. One of the first power supply potential pattern and the first reference potential pattern is provided in a first wiring layer which is the nearest to a lower surface of the wiring substrate among the wiring layers. Another of the first power supply potential pattern and the first reference potential pattern is provided in a second wiring layer which is the next nearest to the lower surface after the first wiring layer. The first power supply potential pattern and the first reference potential pattern extend in the same direction while mutually overlapping.

According to the above-described embodiment, performance of a semiconductor device can be improved.

BRIEF DESCRIPTIONS OF THE DRAWINGS

FIG. 4 is a cross-section view taken along line A-A of FIG. 1.

FIG. 13 is an enlarged plan view of only a power supply potential pattern and a reference potential pattern illustrated in FIG. 11

DETAILED DESCRIPTION

Figure 1:
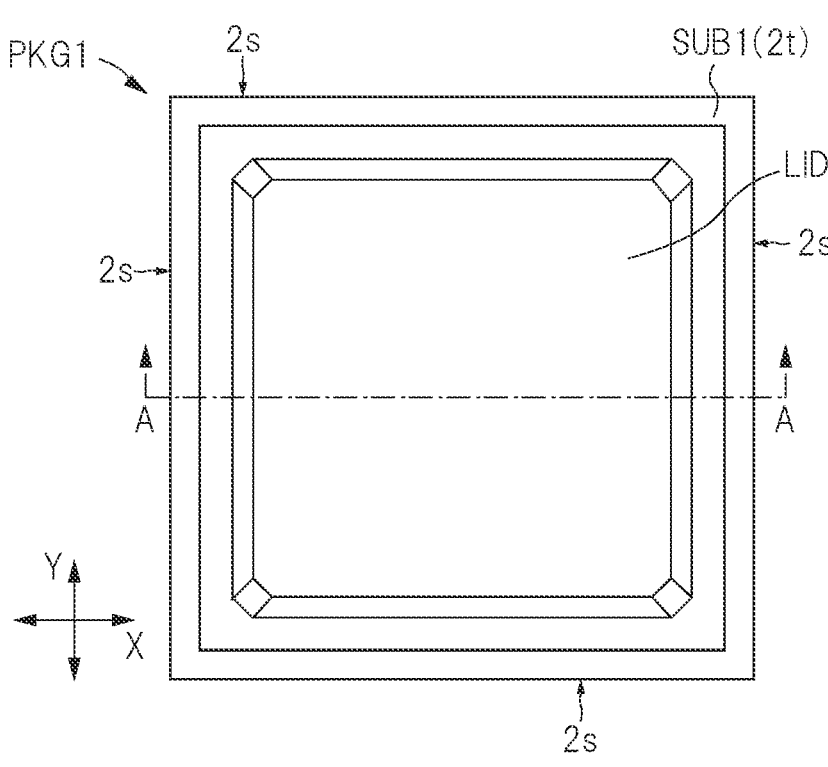
FIG. 1 is a top view of a semiconductor device according to one embodiment.

Description of Explanation Form, Basic Terms, and their Use in Present Application In the present application, the invention will be described in a plurality of sections or embodiments when required as a matter of convenience. However, these sections or embodiments are not irrelevant to each other unless otherwise stated. Regardless of before and after the description, one part of a simple example is a detailed part, a part, or the entire of a modification example of the other. Also, in principle, the repetitive description of the same part is omitted. Further, each element in the embodiment is not indispensable unless otherwise particularly stated not to be so, logically limited to the number, and clearly not to be so from the contexts.

Similarly, when a material, a composition or others is described as "X made of A" or others in the description of the embodiments or others, the one containing other components than A is not excluded unless otherwise stated not to be so and clearly not being so from the contexts. For example, the component means "X containing A as a main component" or others. For example, the component means "X containing A as a main component" or others. For example, it is needless to say that a "silicon material" and others includes not only pure silicon but also SiGe (silicon germanium) alloy or other multicomponent alloy containing silicon as a main component, or a material containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, the specific numerical value and the numerical amount may exceed the specific numerical values or smaller than the specific numerical values unless otherwise specified not to be so, logically limited to the number, and clearly not being so from the contents.

Still further, in each drawing of the embodiment, the same or similar parts are denoted by the same or similar symbol or reference number, and the description thereof is not repeated in principle.

Also, in the attached drawings, hatching or others is omitted even in a cross-sectional view in some cases such as a case of causing complication or a case of clearly distinguishing a portion from a space. In respect to this, a background outline is omitted even in a closed hole in a plan view when being clear from the explanation or others. Further, hatching or a dot pattern is added to a drawing in some cases in order to clearly show that the portion is not the space or clearly show a boundary between regions even if the drawing is not a cross-sectional view.

"Semiconductor component" in the present specification is a component utilizing electron in a semiconductor. As examples of the "semiconductor component", a semiconductor chip and a semiconductor device packaging a semiconductor chip therein can be exemplified. Regardless of whether to include the semiconductor, a component which is embedded in an electric circuit and has an electric function is called "electronic component." Examples of the electronic component include not only the semiconductor component but also a resister element, a capacitor element, an inductor element and others.

Semiconductor Device

Figure 2:
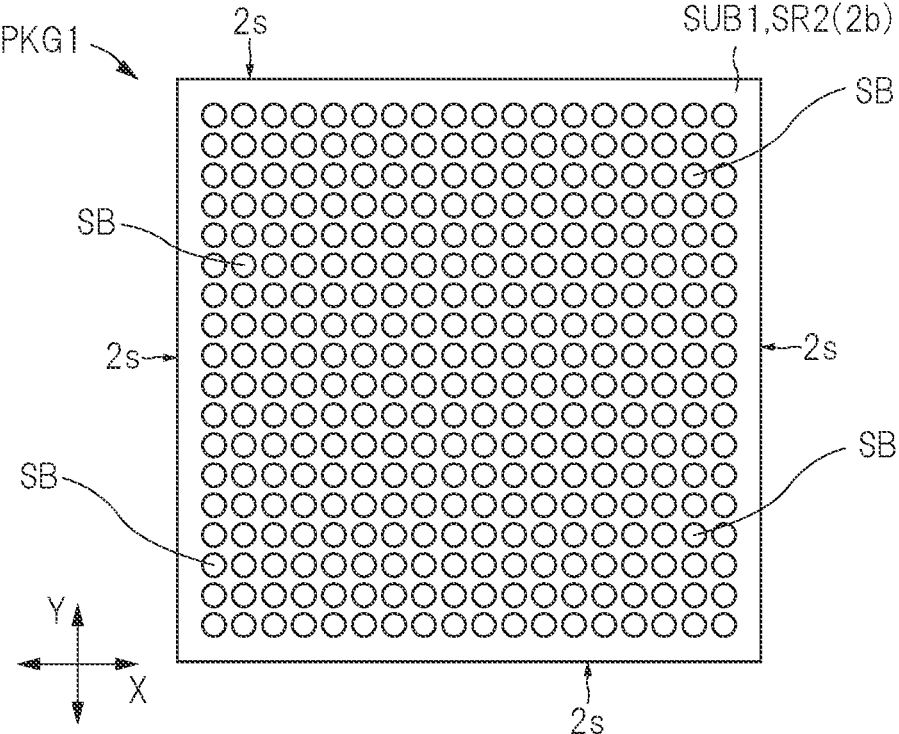
FIG. 2 is a bottom view of the semiconductor device of FIG. 1.
Figure 3:
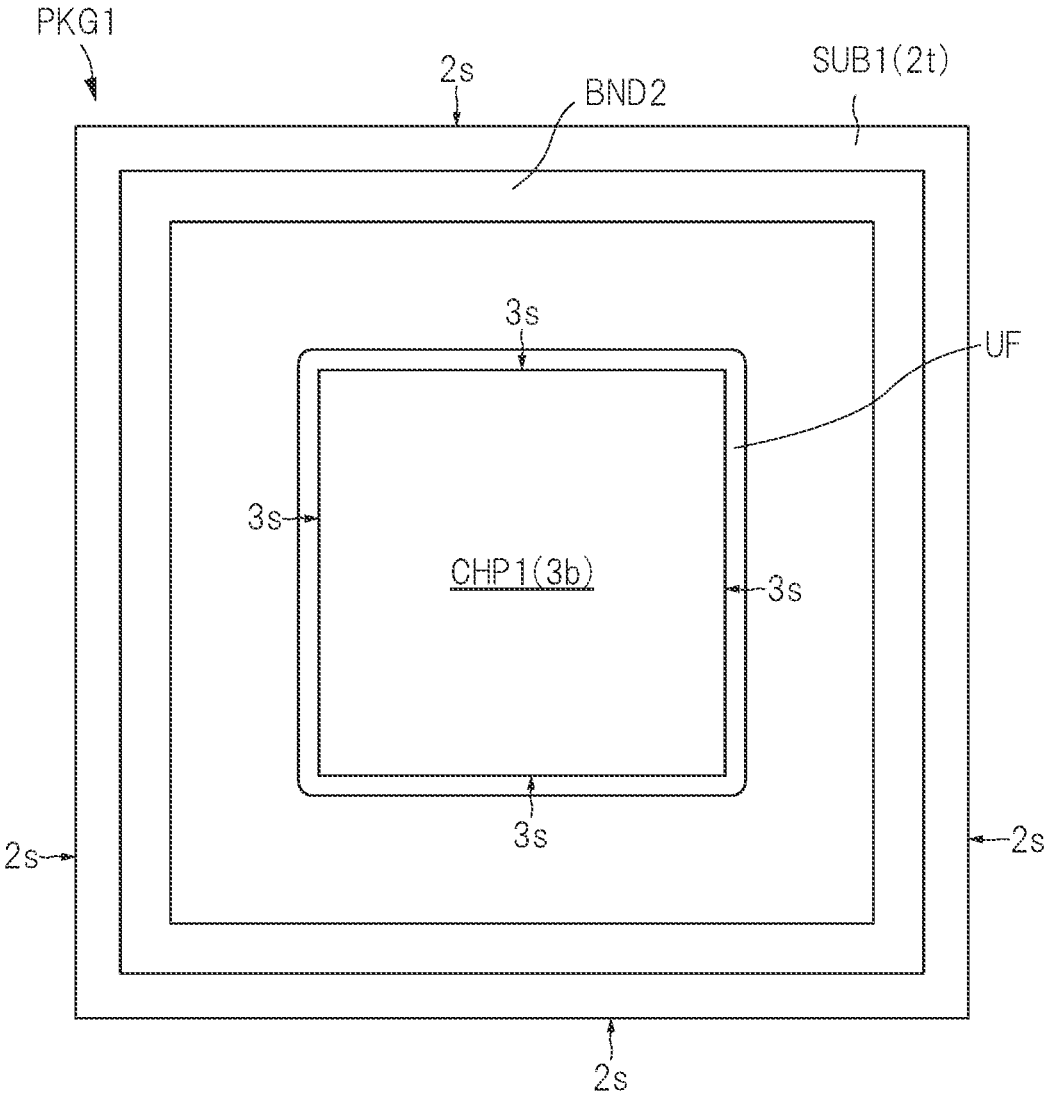
FIG. 3 is a plan view of an internal structure of the semiconductor device illustrated in FIG. 1 on a wiring substrate with a cover member removed.
Figure 4:
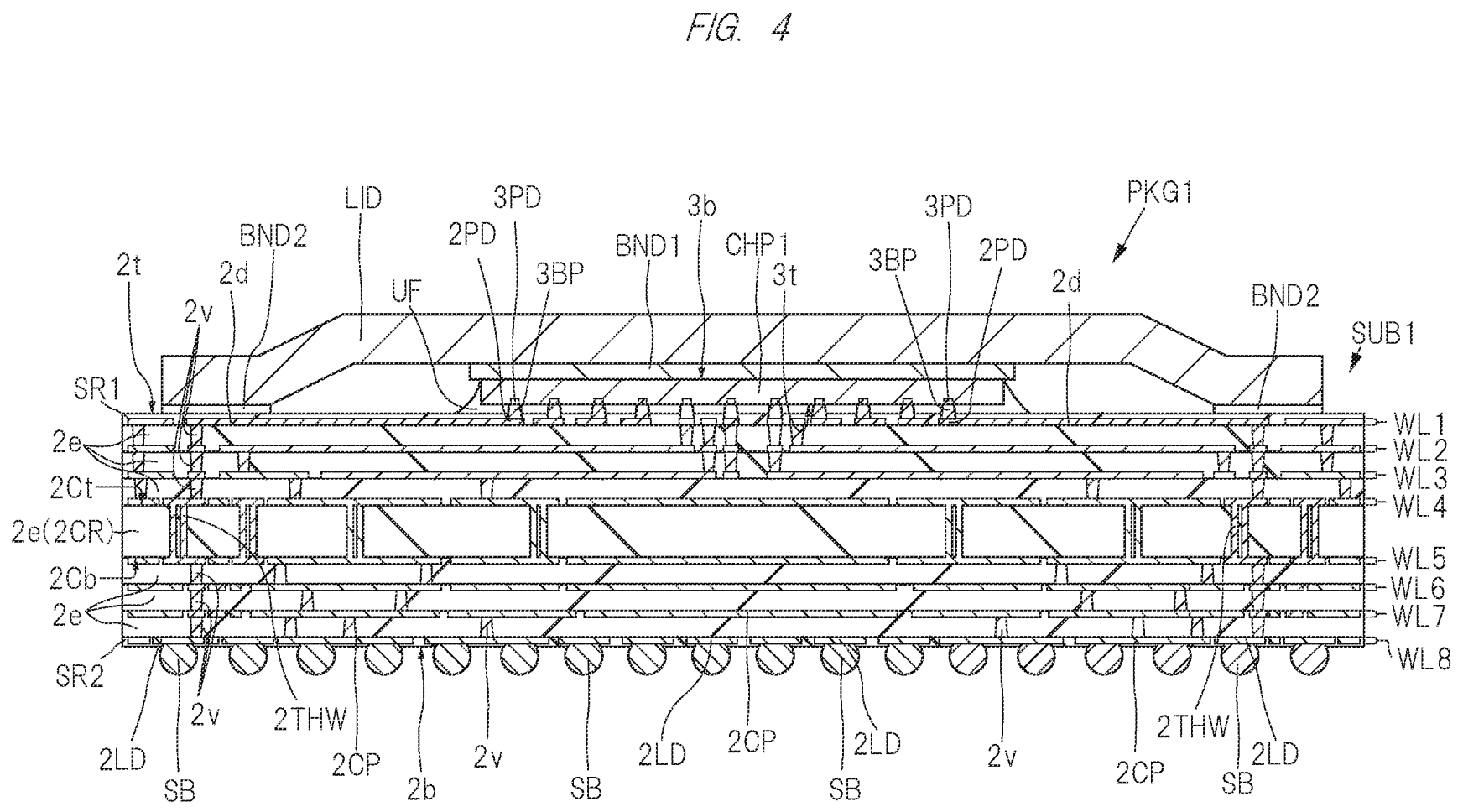

FIG. 1 is a top view of a semiconductor device according to one embodiment. FIG. 2 is a bottom view of the semiconductor device of FIG. 1. FIG. 3 is a plan view of an internal structure of the semiconductor device illustrated in FIG. 1 on a wiring substrate with a cover member removed. FIG. 4 is a cross-section view taken along line A-A of FIG. 1.

A semiconductor device PKG1 according to the present embodiment includes a wiring substrate SUB1, and a semiconductor chip CHP1 (see FIG. 3) mounted on the wiring substrate SUB1. The semiconductor device PKG1 includes a bond layer BND1 arranged on the semiconductor chip CHP1, and a cover member LID configured to cover the entire semiconductor chip CHP1, the entire bond layer BND1, and part of the wiring substrate SUB1, and fixed with the bond layer BND1.

As illustrated in FIG. 4, the wiring substrate SUB1 has an upper surface (surface, main surface, chip mounting surface, first main surface) 2$t$ mounting the semiconductor chip CHP1 thereon and a lower surface (surface, main surface, mounting surface, second main surface) 2$b$ opposite the upper surface 2$t$. The wiring substrate SUB1 has a plurality of sides 2$s$ (see FIGS. 1 to 3) configuring the outer edges of the upper surface 2$t$ and the lower surface 2$b$ in plan view. In the present embodiment, the upper surface 2$t$ (see FIG. 1) and the lower surface 2$b$ (see FIG. 2) of the wiring substrate SUB1 are rectangular, and the wiring substrate SUB1 has four sides 2$s$ in plan view.

The wiring substrate SUB1 includes a plurality of (in the example of FIG. 4, eight) wiring layers WL1, WL2, WL3, WL4, WL5, WL6, WL7, and WL8 provided between the upper surface 2$t$ and the lower surface 2$b$. The wiring layers include the wiring layer WL1 which is the nearest to the upper surface 2$t$ of the wiring substrate SUB1 among the plurality of wiring layers and is provided with terminals (terminals 2PD). The wiring layers further include the wiring layer WL8 which is the nearest to the lower surface 2$b$ of the wiring substrate SUB1 among the plurality of wiring layers and is provided with terminals (lands 2LD).

Each wiring layer has a conductor pattern such as wiring which is a path configured to supply an electric signal or power. An insulative layer 2$e$ is arranged between the wiring layers. The respective wiring layers are electrically connected to each other through a via 2$v$ which is an interlayer conductive path penetrating through the insulative layer 2$e$ or a through-hole wiring 2THW. In the present embodiment, a wiring substrate including eight wiring layers is illustrated as an example of the wiring substrate SUB1, but the number of wiring layers of the wiring substrate SUB1 is not limited to eight. A wiring substrate including seven or less wiring layers or nine or more wiring layers may be employed in a modification example.

The nearest wiring layer WL1 (the uppermost layer) to the upper surface 2$t$ among the wiring layers is covered with an insulative film SR1. The insulative film SR1 is provided with openings, and the terminals 2PD provided on the wiring layer WL1 are exposed from the insulative film SR1 at the openings. A plurality of lands is provided on the nearest wiring layer WL8 (the lowermost wiring layer) to the lower surface 2$b$ of the wiring substrate SUB1 among the wiring layers. The wiring layer WL8 is covered with an insulative film SR2. The insulative film SR1 and the insulative film SR2 are solder-resist films. The terminals 2PD provided on the wiring layer WL1 are electrically connected to the lands (land patterns) 2LD provided on the wiring layer WL8, respectively, through the conductor patterns (wirings 2*d* or large-area conductor patterns), the vias 2*v*, and the through-hole wirings 2THW, which are formed on the wiring layers of the wiring substrate SUB1.

The wiring substrate SUB1 is formed by, for example, a buildup method of stacking the respective wiring layers on an upper surface 2Ct and a lower surface 2Cb of an insulative layer (core material, core insulative layer) 2CR which is made of prepreg in which resin is immersed in a glass fiber. The wiring layer WL4 on the side of the upper surface 2Ct of the insulative layer 2CR is electrically connected to the wiring layer WL5 on the side of the lower surface 2Cb through the plurality of through-hole wirings 2THW embedded in a plurality of through holes configured to penetrate from one of the upper surface 2Ct and the lower surface 2Cb to the other thereof.

In the example of FIG. 4, the wiring substrate SUB1 is described as a wiring substrate in which a plurality of wiring layers is stacked on the sides of the upper surface 2Ct and the lower surface 2Cb of the insulative layer 2CR as a core material. A modification example of FIG. 4 employs so-called coreless substrate in which the insulative layers 2*e* and the conductor patterns such as the wirings 2*d* are sequentially stacked without the insulative layer 2CR made of a hard material such as prepreg. In the case of use of the coreless substrate, the wiring layers are electrically connected through the vias 2*v* without the formation of the through-hole wirings 2THW.

In the example of FIG. 4, solder balls (solder materials, external terminals, electrodes, external electrodes) SB are connected to the lands 2LD, respectively. The solder balls SB are conductive members configured to electrically connect a plurality of terminals (not illustrated) on the motherboard side with the lands 2LD when the semiconductor device PKG1 is mounted on the motherboard (not illustrated). The solder balls SB are made of, for example, a lead (Pb)-containing Sn—Pb solder material or so-called lead-free solder material substantially not containing Pb. Examples of lead-free solder include only tin (Sn), tin-bismuth (Sn—Bi), tin-copper-silver (Sn—Cu—Ag), tin-copper (Sn—Cu), and the like. The lead-free solder described here means a material, a lead (Pb) content of which is 0.1 wt % or less, and the content is defined in accordance with Restriction of Hazardous Substances (RoHS) Directive.

A plurality of solder balls SB is arranged in a matrix shape (array shape) as illustrated in FIG. 2. Although not illustrated in FIG. 2, the lands 2LD (see FIG. 4) bonded with the solder balls SB are also arranged in a matrix shape (array shape). In this manner, a semiconductor device in which a plurality of external terminals (solder balls SB, lands 2LD) is arranged in a matrix shape on the mounting surface of the wiring substrate SUB1 is called area-array-type semiconductor device. In the area-array-type semiconductor device, the mounting surface (lower surface 2*b*) of the wiring substrate SUB1 is effectively used as an arranging space for the external terminals, and thus this type is preferable in a viewpoint that is suppression of an increase in the mounting area of the semiconductor device even in increase in the number of external terminals. That is, a semiconductor device with the increase in the number of external terminals along with higher functionality and higher integration can be mounted in a small space.

The semiconductor device PKG1 includes the semiconductor chip CHP1 mounted on the wiring substrate SUB1. As illustrated in FIG. 4, each semiconductor chip CHP1 has a front surface (main surface, upper surface) 3*t* and a back surface (main surface, lower surface) 3*b* opposite the front surface 3*t*. The semiconductor chip CHP1 has a plurality of sides 3*s* configuring the outer edges of the front surface 3*t* and the back surface 3*b* in plan view. The semiconductor chip CHP1 is formed in a square outer shape with the smaller plane area than that of the wiring substrate SUB1 in plan view as illustrated in FIG. 3. Thus, the semiconductor chip CHP1 has four sides 3*s* in plan view. In the example of FIG. 3, the semiconductor chip CHP1 is mounted at the center of the upper surface 2*t* of the wiring substrate SUB1, and the four sides 3*s* of the semiconductor chip CHP1 extend along the four sides 2*s* of the wiring substrate SUB1, respectively.

A plurality of electrodes (pads, electrode pads, bonding pads) 3PD is formed on the upper surface 3*t* side of the semiconductor chip CHP1. In the example of FIG. 4, the semiconductor chip CHP1 is mounted on the wiring substrate SUB1 in a state in which the upper surface 3*t* faces the upper surface 2*t* of the wiring substrate SUB1. Such a mounting method is called face-down mounting method or flip-chip connecting method.

Although not illustrated, a plurality of semiconductor elements (circuit elements) is formed on the main surface of the semiconductor CHP1 (more specifically, a semiconductor element forming region provided on an element forming surface of a semiconductor substrate that is a base member of the semiconductor chip CHP1). The plurality of electrodes 3PD is electrically connected to the plurality of semiconductor elements, respectively, through the wirings (not illustrated) formed on a wiring layer arranged inside the semiconductor chip CHP1 (more specifically, between the upper surface 3*t* and a semiconductor element forming region not illustrated).

The semiconductor substrate provided in the semiconductor chip CHP1 is made of, for example, silicon (Si). An insulative film covering the semiconductor substrate and the wirings is formed on the upper surface 3*t* of the semiconductor chip CHP1, and part of each electrode 3PD (see FIG. 4) is exposed from the insulative film at an opening formed in the insulative film. The electrodes 3PD are made of a metal, and are made of, for example, aluminum (Al) in the present embodiment.

As illustrated in FIG. 4, the electrodes 3PD are connected with bump electrodes 3BP, respectively, and the electrodes 3PD of the semiconductor chip CHP1 are electrically connected to the terminals 2PD of the wiring substrate SUB1 via the bump electrodes 3BP, respectively. The bump electrodes 3BP are metal members (conductive members) formed to protrude above the from surface 3*t* of the semiconductor chip CHP1. The bump electrodes 3BP in the present embodiment are so-called solder bumps in which a solder material is stacked above an electrode 3PD via an underlying metal film (under bump metal). The lead-containing solder material or the lead-free solder may be used as the solder material making the solder bumps as similar to the solder balls SB. When the semiconductor chip CHP1 is mounted on the wiring substrate SUB1, a heating processing (reflow processing) is performed while the solder bumps that are previously formed on both of the electrodes 3PD and the terminals 2PD are contacted with each other, and thus the solder bumps are unified to form the bump electrodes 3BP. In a modification example of the present embodiment, pillar bumps in which a solder film is formed on a tip surface of a conductor pillar made of copper (Cu) or nickel (Ni) may be used as the bump electrodes 3BP.

Underfill resin (insulative resin) UF is arranged between the semiconductor chip CHP1 and the wiring substrate SUB1 as illustrated in FIG. 4. The underfill resin UF is arranged to close a space between the front surface 3t of the semiconductor chip CHP1 and the upper surface 2t of the wiring substrate SUB1. The bump electrodes 3BP are sealed by the underfill resin UF. The underfill resin UF is made of an insulative (non-conductive) material (such as resin material) and is arranged to seal the electric connections (bonding parts of the bump electrodes 3BP) between the semiconductor chip CHP1 and the wiring substrate SUB1. In this manner, when the bonding parts between the bump electrodes 3BP and the terminals 2PD are covered with the underfill resin UF, stress caused at the electric connections between the semiconductor chip CHP1 and the wiring substrate SUB1 can be reduced. The stress caused at the bonding parts between the electrodes 3PD of the semiconductor chip CHP1 and the bump electrodes 3BP can be also reduced. Further, the main surface of the semiconductor chip CHP1, on which the semiconductor elements (circuit elements) are formed, can be protected.

The cover member (lid, heat spreader, heat radiating member) LID is arranged on the back surface 3b of the semiconductor chip CHP1. The cover member LID is, for example, a metal plate with a higher heat conductivity than that of the wiring substrate SUB1, and has a function to discharge heat caused in the semiconductor chip CHP1 to the outside. The cover member LID is thermally connected to the semiconductor chip CHP1 via the bond layer BND1. The bond layer BND1 contacts with the semiconductor chip CHP1 and the cover member LID.

The bond layer BND1 is made of an adhesive obtained by, for example, hardening a paste that is mixed with a filler in a resin paste. As examples of the filler, metallic particles and metallic oxide particles such as alumina can be exemplified. The bond layer BND1 contains a filler which is mixed to improve the heat radiation property, and thus can improve the heat conductivity between the semiconductor chip CHP1 and the cover member LID as compared with filler-free resin adhesives.

A peripheral region of the cover member LID is adhered and fixed to the upper surface 2t of the wiring substrate SUB1 via a bond layer BND2. The bond layer BND2 does not need the heat radiation property as different from the bond layer BND1, and thus its material is not particularly limited, and can be optionally selected as long as the material has a necessary adhesive strength. For example, when the same material as that of the bond layer BND1 is used, its manufacturing steps can be simplified. Alternatively, for example, a material with a higher adhesive strength than that of the bond layer BND1 may be used.

A semiconductor device attached with the cover member LID functioning as a heat radiating member as similar to the semiconductor device PKG1 can stably operate the circuits therein even in the case of higher functionality because of having a high heat radiation efficiency of the semiconductor chip CHP1. In a modification example of the present embodiment, a structure of the wiring substrate SUB1 described later may be applied to a semiconductor device without the cover member LID, the bond layer BND1 and the bond layer BND2 illustrated in FIG. 4.

Exemplary Circuit Structure

Figure 5:
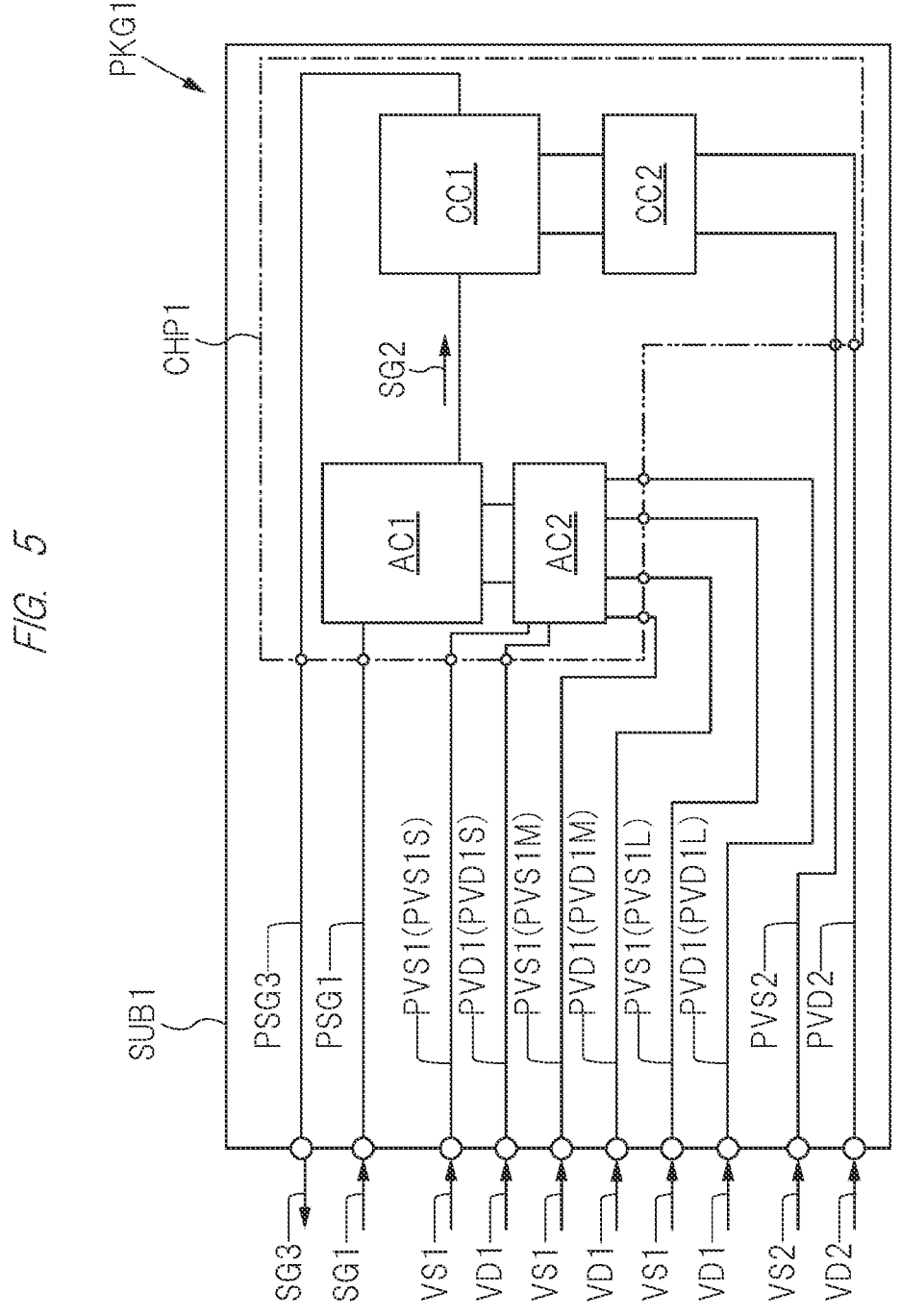
FIG. 5 is an explanatory diagram of an exemplary structure of circuits included in the semiconductor device of FIG. 4.

Next, an exemplary structure of circuits provided in the semiconductor device PKG1 of FIG. 4 will be described. FIG. 5 is an explanatory diagram of an exemplary structure of circuits provided in the semiconductor device PKG1 of FIG. 4. Note that some of a plurality of circuits, some of a plurality of signal transmission paths and some of a plurality of power supply paths provided in the semiconductor device PKG1 are illustrated in FIG. 5 as example.

As illustrated in FIG. 5, the semiconductor chip CHP1 of the semiconductor device PKG1 according to the present embodiment includes an analog circuit AC1. In the example of FIG. 5, the semiconductor chip CHP1 includes the analog circuit AC1, and a core circuit CC1 electrically coupled to the analog circuit AC1. The analog circuit AC1 is, for example, a PLL circuit configured to generate a new signal synchronized with a phase of an input signal.

In the example of FIG. 5, a signal (alternate-current signal, high-frequency signal) SG1 is input from an external device of the semiconductor device PKG1 into the analog circuit AC1. The signal SG1 is input into the analog circuit AC1 of the semiconductor chip CHP1 via a signal transmission path PSG1 of the wiring substrate SUB1. The analog circuit AC1 includes a phase comparator, a filter circuit and an oscillator not illustrated, and outputs a new signal (alternate-current signal, high-frequency signal) SG2 synchronized with a phase of the signal SG1 and a phase of a comparison-target input signal not illustrated. The signal SG2 is input into the core circuit CC1. The core circuit CC1 performs a data processing (such as operation processing) to the input signal SG2, and outputs a signal (alternate-current signal, high-frequency signal) SG3. The signal SG3 is output from the core circuit CC1 of the semiconductor chip CHP1 to an external device not illustrated via a signal transmission path PSG3 of the wiring substrate SUB1. By the analog circuit AC1 that is the PLL circuit, the synchronization processing is performed to the signal SG2 to be input into the core circuit CC1. Thus, the signal SG2 with less phase fluctuation (jitter) is supplied to the core circuit CC1. The core circuit CC1 is, for example, a digital circuit, but may be an analog circuit.

The semiconductor chip CHP1 includes a power circuit AC2 configured to supply (capable of supplying) power to the analog circuit AC1 and a power circuit CC2 configured to supply (capable of supplying) power to the core circuit CC1. A power supply potential VD1 and a reference potential VS1 are supplied to the analog circuit AC1 via the power circuit AC2. On the other hand, a power supply potential VD2 and a reference potential VS2 are supplied to the core circuit CC1 via the power circuit CC2.

The power supply potential VD1 is supplied to the power circuit AC2 of the semiconductor chip CHP1 via a power supply potential supplying path PVD1 of the wiring substrate SUB1. The reference potential VS1 is supplied to the power circuit AC2 of the semiconductor chip CHP1 via a reference potential supplying path PVS1 of the wiring substrate SUB1. The power supply potential VD2 is supplied to the power circuit CC2 of the semiconductor chip CHP1 via a power supply potential supplying path PVD2 of the wiring substrate SUB1. The reference potential VS2 is supplied to the power circuit CC2 of the semiconductor chip CHP1 via a reference potential supply path PVS2 of the wiring substrate SUB1.

Note that the reference potential VS1 is different from the power supply potential VD1, and may be a potential other than a ground potential. Similarly, the reference potential VS2 is different from the power supply potential VD2, and may be a potential other than a ground potential. The reference potential VS1 may be the same as or different from the reference potential VS2. As described later, in the present embodiment, even if the reference potential VS1 is the same as the reference potential VS2, the reference potential supply path PVS1 and the reference potential supply path PVS2 are configured of mutually separated wiring patterns.

In order to stably operate the analog circuit AC1 of FIG. 5, it is necessary to reduce a change in potential difference between the power supply potential VD1 and the reference potential VS1 supplied to the analog circuit AC1 via the power circuit AC2. This is because the change in potential difference between the power supply potential VD1 and the reference potential VS1 reduces the quality of the signal SG2 output from the analog circuit AC1. The followings may be exemplified as noise sources influencing the change in potential difference between the power supply potential VD1 and the reference potential VS1. For example, noise induced by the signal SG1 or the signal SG3 as a high-frequency signal may influence the potential difference between the power supply potential VD1 and the reference potential VS1. Further, for example, the power supply potential VD2 may be instantaneously changed by influence of a power demand of the core circuit CC1. At this time, if the power supply potential supplying path PVD2 is arranged near the power supply potential supplying path PVD1 and the reference potential supply path PVS1, noise caused in the power supply potential VD2 may influence the potential difference between the power supply potential VD1 and the reference potential VS1.

In order to reduce the influence of noise on the potential difference between the power supply potential VD1 and the reference potential VS1, it is preferable to shorten the path distances of the power supply potential supplying path PVD1 and the reference potential supply path PVS1. The shortened path distances enable inductance of the power supply potential supplying path PVD1 and the reference potential supply path PVS1 to be reduced, and thus the influence of noise is reduced.

However, the number of external terminals of each semiconductor device tends to increase along with higher functionality of the semiconductor device. Further, an arrangement density of a plurality of external terminals tends to be high in order to downsize the semiconductor device. The power supply potential supplying path PVD1 and the reference potential supply path PVS1 may be inevitably longer. In other words, if the influence of noise can be reduced even when the path distances of the power supply potential supplying path PVD1 and the reference potential supply path PVS1 are long, a degree of freedom for design can be improved. A next section explains a technique for reducing the influence of noise by developing the layout of the power supply potential supplying path PVD1 and the reference potential supply path PVS1 in the wiring substrate SUB1.

Layout of Power Supply Paths

Figure 6:
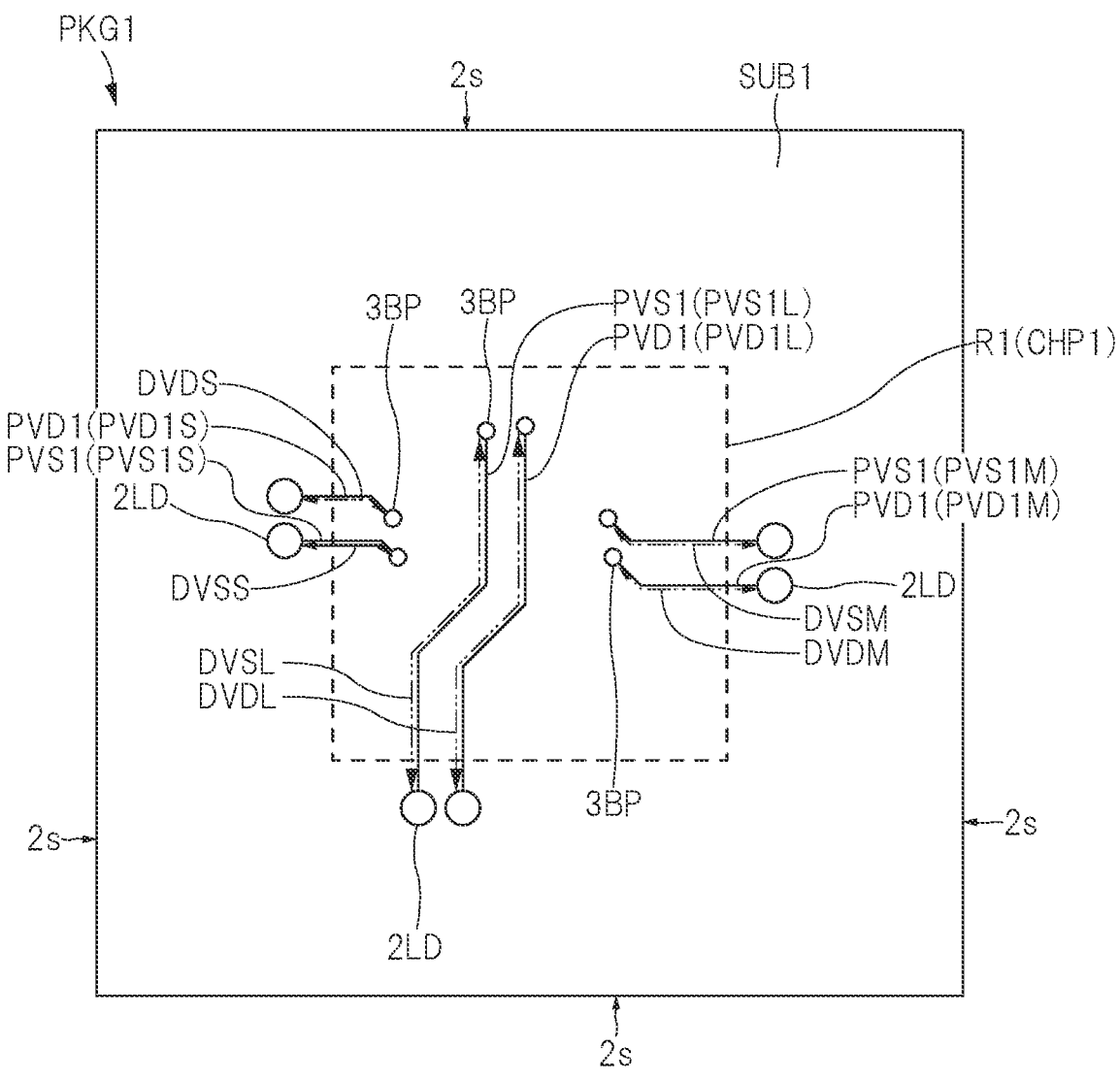
FIG. 6 is a schematic explanatory diagram of paths configured to supply power to an analog circuit of FIG. 5.

FIG. 6 is a schematic explanatory diagram of the paths configured to supply power to the analog circuits of FIG. 5. A contour of a region R1 overlapping with the semiconductor chip CHP1 is illustrated with a dotted line in FIG. 6.

The semiconductor device PKG1 includes a plurality of pairs of the power supply potential supplying paths PVD1 and the reference potential supply paths PVS1 as illustrated in FIG. 6. The power supply potential supplying paths PVD1 and the reference potential supply paths PVS1 are arranged in pairs.

The bump electrodes 3BP are arranged within the region R1 overlapping with the semiconductor chip CHP1. Lands 2LD, which are included in either the power supply potential supplying paths PVD1 or the reference potential supply paths PVS1, among the lands 2LD are arranged outside the region R1 in plan view. The lands included in the power supply potential supplying path PVD2 and the reference potential supply path PVS2, which are configured to mainly supply power to the core circuit CC1 of FIG. 5, are arranged in the region R1 (particularly the region overlapping with the core circuit CC1 of FIG. 5). Thus, it is difficult in the region R1 to secure a space for arranging the lands 2LD included in either the power supply potential supplying paths PVD1 or the reference potential supply paths PVS1. Note that some of the lands 2LD included in either the power supply potential supplying paths PVD1 or the reference potential supply paths PVS1 may be arranged within the region R1.

The bump electrodes 3BP and the lands 2LD, which are electrically connected to each other, are preferably arranged near each other in transparent plan view. However, the lands 2LD may be difficult to be arranged near the bump electrodes 3BP depending on a design condition. The example of FIG. 6 shows a power supply potential supplying path PVD1S and a reference potential supply path PVS1S whose path distances connecting the bump electrodes 3BP and the lands 2LD are relatively short, and a power supply potential supplying path PVD1L and a reference potential supply path PVS1L whose path distances connecting the bump electrodes 3BP and the lands 2LD are relatively long. FIG. 6 further illustrates a power supply potential supplying path PVD1M and a reference potential supply path PVS1M whose path distances connecting the bump electrodes 3BP and the lands 2LD are relatively medium.

The path distances of the power supply potential supplying path PVD1S and the reference potential supply path PVS1S (a path distance DVDS and a path distance DVSS between the bump electrodes 3BP and the lands 2LD) are, for example, 5 mm or less. The path distances of the power supply potential supplying path PVD1M and the reference potential supply path PVS1M (a path distance DVDM and a path distance DVSM between the bump electrodes 3BP and the lands 2LD) are, for example, more than 5 mm and 7 mm or less. The path distances of the power supply potential supplying path PVD1L and the reference potential supply path PVS1L (a path distance DVDL and a path distance DVSL between the bump electrodes 3BP and the lands 2LD) are, for example, more than 7 mm. The path distances of the power supply potential supplying path PVD1L and the reference potential supply path PVS1L may be 10 mm or more.

The relations among the path distances illustrated in FIG. 6 may be expressed as follows. The path distance of the power supply potential supplying path PVD1L including a power supply potential pattern LVD1 (see FIG. 11 described later) between a bump electrode 3BP of the semiconductor chip CHP1 (see FIG. 4) and a land 2LD of the wiring substrate SUB1 is assumed as path distance DVDL. The path distance of the reference potential supply path PVS1L including a reference potential pattern LVS1 (see FIG. 11 described later) between a bump electrode 3BP of the semiconductor chip CHP1 and a land 2LD of the wiring substrate SUB1 is assumed as path distance DVSL. The path distance of the power supply potential supplying path PVD1S including a power supply potential pattern LVD3 (see FIG. 7 described later) between a bump electrode 3BP of the semiconductor chip CHP1 and a land 2LD of the wiring substrate SUB1 is assumed as path distance DVDS. The path distance of the reference potential supply path PVS1S including a reference potential pattern LVS3 (see FIG. 7 described later) between a bump electrode 3BP of the semiconductor chip CHP1 and a land 2LD of the wiring substrate SUB1 is assumed as path distance DVSS. The path distance of the power supply potential supplying path PVD1M including a power supply potential pattern LVD4 (see FIG. 9 described later) between a bump electrode 3BP of the semiconductor chip CHP1 (see FIG. 4) and a land 2LD of the wiring substrate SUB1 is assumed as path distance DVDM. The path distance of the reference potential supply path PVS1M including a reference potential pattern LVS4 (see FIG. 9 described later) between a bump electrode 3BP of the semiconductor chip CHP1 and a land 2LD of the wiring substrate SUB1 is assumed as path distance DVSM. In this case, the path distance DVDL is longer than the path distance DVDM, the path distance DVDS, the path distance DVSM, and the path distance DVSS. The path distance DVSL is longer than the path distance DVDM, the path distance DVDS, the path distance DVSM, and the path distance DVSS. The path distance DVDM is longer than the path distance DVDS and the path distance DVSS. The path distance DVSM is longer than the path distance DVDS and the path distance DVSS.

In the example of FIG. 6, in particular, noise countermeasures need to be preferentially applied to the power supply potential supplying path PVD1L and the reference potential supply path PVS1L. Noise countermeasures need to be preferentially applied to the power supply potential supplying path PVD1M and the reference potential supply path PVS1M over the power supply potential supplying path PVD1S and the reference potential supply path PVS1S. Noise countermeasures will be described in details below.

First Noise Countermeasure

Figure 7:
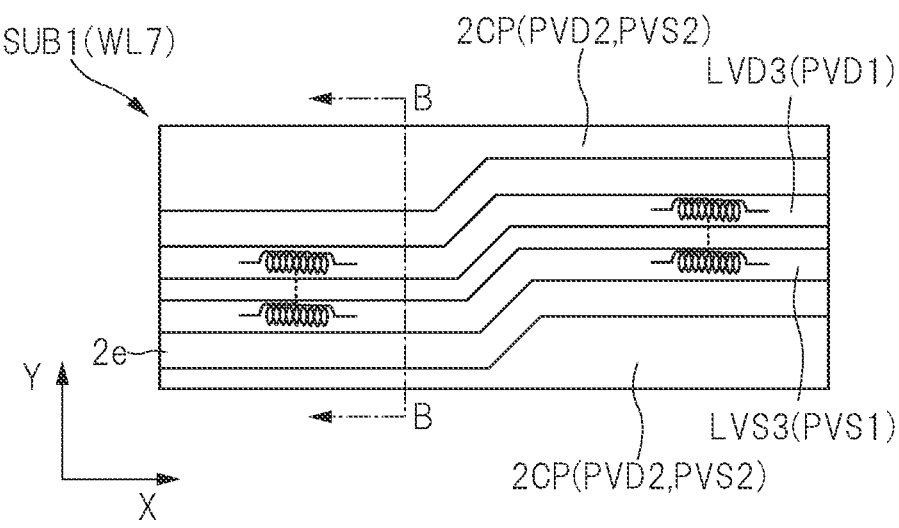
FIG. 7 is an enlarged plan view of exemplary noise countermeasures for power supply potential supplying paths and reference potential supply paths illustrated in FIG. 6.
Figure 8:
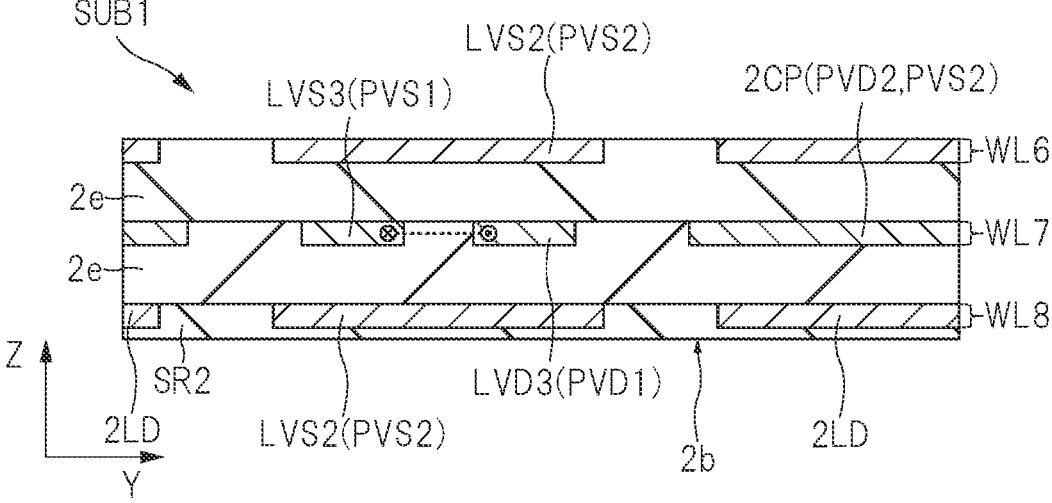
FIG. 8 is an enlarged cross-section view taken along line B-B of FIG. 7.

Noise countermeasures effectively applicable to the power supply potential supplying path PVD1S and the reference potential supply path PVS1S illustrated in FIG. 6 will be first described as first noise countermeasures. FIG. 7 is an enlarged plan view of exemplary noise countermeasures for the power supply potential supplying paths and the reference potential supply paths illustrated in FIG. 6. FIG. 8 is an enlarged cross-section view taken along line B-B of FIG. 7. Symbols in FIGS. 7 and 8 are given to schematically show an inductive coupling state between the power supply potential pattern LVD3 configuring the power supply potential supplying path PVD1 and the reference potential pattern LVS3 configuring the reference potential supply path PVS1. The wiring layer illustrated in FIG. 7 among the wiring layers illustrated in FIG. 4 is, for example, a wiring layer WL7. The wiring layer WL7 among the wiring layers is the next nearest to the lower surface 2b of the wiring substrate SUB1 after the wiring layer WL8 as illustrated in FIGS. 4 and 8. Although not illustrated, the power supply potential pattern LVD3 and the reference potential pattern LVS3 as similar to those in FIG. 7 in a modification example may be arranged in the wiring layers other than the wiring layer WL7.

A method of inductively coupling the power supply potential pattern LVD3 and the reference potential pattern LVS3 is effective as a method of reducing the influence of noise on the power supply potential supplying path PVD1 and the reference potential supply path PVS1 illustrated in FIG. 6. Inductive coupling means a state in which mutual induction between a power supply potential supplying path and a reference potential supply path dominantly works. When a power supply potential supplying path and a reference potential supply path are inductively coupled, loop inductance between the paths can be reduced by mutual induction. Consequently, a variation in voltage with respect to high-frequency current components can be suppressed (in other words, self-noise can be reduced). For example, when high-frequency noise or pulse noise is on the power supply potential pattern LVD3 to which a fixed potential is supplied, if the power supply potential pattern LVD3 and the reference potential pattern LVS3 are inductively coupled, a variation in potential with respect to high-frequency current components flowing in the loop path can be suppressed.

The power supply potential pattern LVD3 and the reference potential pattern LVS3 are formed in the same wiring layer WL7 as illustrated in FIG. 7. The power supply potential pattern LVD3 and the reference potential pattern LVS3 extend in the same direction while being mutually adjacent in plan view. The power supply potential pattern LVD3 and the reference potential pattern LVS3 are inductively coupled as schematically illustrated with capacitor circuit symbols in FIGS. 7 and 8.

Effects of the noise countermeasures using inductively coupling the power supply potential pattern LVD3 and the reference potential pattern LVS3 are proportional to a magnitude of mutual inductance between the power supply potential pattern LVD3 and the reference potential pattern LVS3. Thus, the larger a facing path width of the power supply potential pattern LVD3 and the reference potential pattern LVS3 facing each other via the insulative layer 2e is, and besides, the smaller a separation distance between the facing patterns is, the more the noise countermeasure effect is. Note that the facing path width means a width of a part at which the power supply potential supplying path and the reference potential supply path face each other. In the example of FIG. 8, each thickness (each length in the Z direction of FIG. 8) of the power supply potential pattern LVD3 and the reference potential pattern LVS3 corresponds to the facing path width. Thus, in the example of FIG. 8, the thicknesses of the power supply potential pattern LVD3 and the reference potential pattern LVS3, which are in parallel with each other, are preferably larger, and the separation distance between the power supply potential pattern LVD3 and the reference potential pattern LVS3 are preferably shorter.

Conductor patterns 2CP are arranged adjacent to the power supply potential pattern LVD3 and the reference potential pattern LVS3, respectively, in plan view of FIG. 7. The conductor patterns 2CP are paths through which any potential is supplied. For example, the conductor pattern 2CP configures either the power supply potential supplying path PVD2 or the reference potential supply path PVS2 described in FIG. 5. Alternatively, the conductor pattern 2CP illustrated in FIG. 7 may configure other potential supply path not illustrated.

The wiring substrate SUB1 includes a reference potential pattern LVS2 (see FIG. 8) capable of supplying the reference potential VS2 to a circuit (such as the core circuit CC1 of FIG. 5) other than the analog circuit AC1 of FIG. 5. The reference potential pattern LVS2 is a conductor pattern configuring part of the reference potential supply path PVS2 of FIG. 5. As illustrated in FIG. 8, the reference potential patterns LVS2 are formed in the wiring layer WL6 and the wiring layer WL8 which are adjacent to the wiring layer WL7 where a power supply potential pattern LVD3 and a reference potential pattern LVS3 are formed, among the wiring layers of the wiring substrate SUB1, and overlap with the power supply potential pattern LVD3 and the reference potential pattern LVS3. The reference potential patterns LVS2 in the wiring layer WL6 and the wiring layer WL8 preferably extend in the same direction while overlapping with the power supply potential pattern LVD3 and the reference potential pattern LVS3.

The reference potential pattern LVS2 functions as an electromagnetic shield configured to suppress surrounding noise from reaching the power supply potential pattern LVD3 and the reference potential pattern LVS3. When the reference potential pattern LVS2 functioning as an electromagnetic shield is provided as illustrated in FIG. 8, noise applied to the power supply potential pattern LVD3 and the reference potential pattern LVS3 can be reduced.

The example of FIGS. 7 and 8 shows the embodiment in which the power supply potential pattern LVD3 and the reference potential pattern LVS3 are formed in the wiring layer WL7, and thus the reference potential patterns LVS2 functioning as electromagnetic shields are arranged in the wiring layer WL6 and the wiring layer WL8. In a modification example, the power supply potential pattern LVD3 and the reference potential pattern LVS3 may be formed in the wiring layer WL8. In this case, if the reference potential pattern LVS2 is arranged in the wiring layer WL7, the structure of the wiring layer WL6 is not particularly limited.

In the method illustrated in FIGS. 7 and 8, the thicknesses of the power supply potential pattern LVD3 and the reference potential pattern LVS3 are difficult to remarkably increase. The thicknesses of the power supply potential pattern LVD3 and the reference potential pattern LVS3 illustrated in FIG. 8 are, for example, about 10 to 20 μm. Thus, an upper limit of mutual induction between the power supply potential pattern LVD3 and the reference potential pattern LVS3 is low. Therefore, the method illustrated in FIGS. 7 and 8 is of limited effectiveness for the noise countermeasures on, for example, the paths with a long distance and large path inductance such as the power supply potential supplying path PVD1M or the power supply potential supplying path PVD1L of FIG. 6.

As described above, the power supply potential supplying path PVD1S and the reference potential supply path PVS1S illustrated in FIG. 6 have the path distance DVDS and the path distance DVSS of 5 mm or less, respectively, and have small path inductance (have smaller path inductance than, for example, that of the power supply potential supplying path PVD1M or the power supply potential supplying path PVD1L). Thus, the case of the power supply potential pattern LVD3 and the reference potential pattern LVS3 can reduce the noise even when the power supply potential pattern LVD3 and the reference potential pattern LVS3 are formed in the same wiring layer WL7 as illustrated in FIG. 7.

Second Noise Countermeasures

Noise countermeasure technique effectively applicable to the power supply potential supplying path PVD1M and the power supply potential supplying path PVD1L illustrated in FIG. 6 will be described below as second noise countermeasures. The second noise countermeasures and third noise countermeasures will be described below in assumption that at least one of the power supply potential pattern LVD1 and the reference potential pattern LVS1 is arranged in the lowermost wiring layer WL8. A method of adding a new wiring layer for noise countermeasures in addition to the wiring layers WL1 to WL8 of FIG. 4 is also considerable. However, an increase in the number of wiring layers causes demerits such as an increase in the thickness of the semiconductor device, an increase in the steps of manufacturing the wiring substrate, or an increase in manufacturing cost due to an increase in the number of materials for making the wiring substrate. Thus, the present inventors have studied a technique for reducing noise by use of the lowermost wiring layer WL8 without adding the wiring layer for noise countermeasures.

Figure 9:
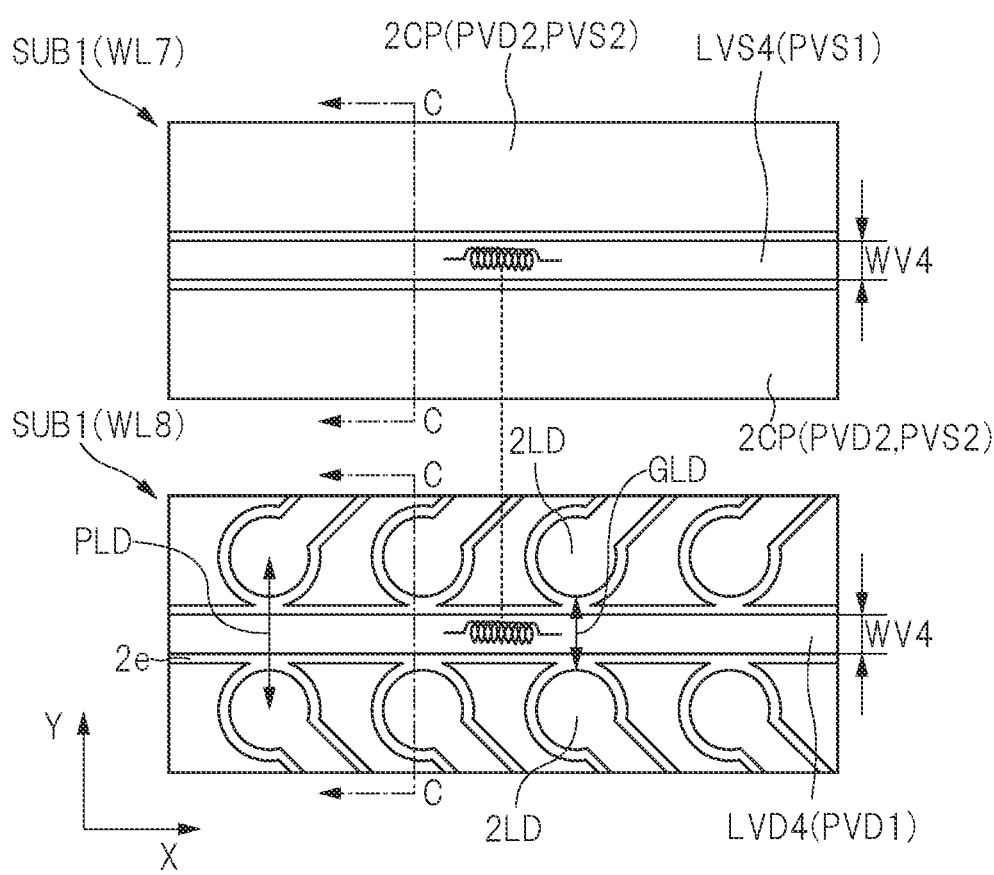
FIG. 9 is an enlarged plan view of another exemplary noise countermeasures for the power supply potential supplying paths and the reference potential supply paths illustrated in FIG. 6.
Figure 10:
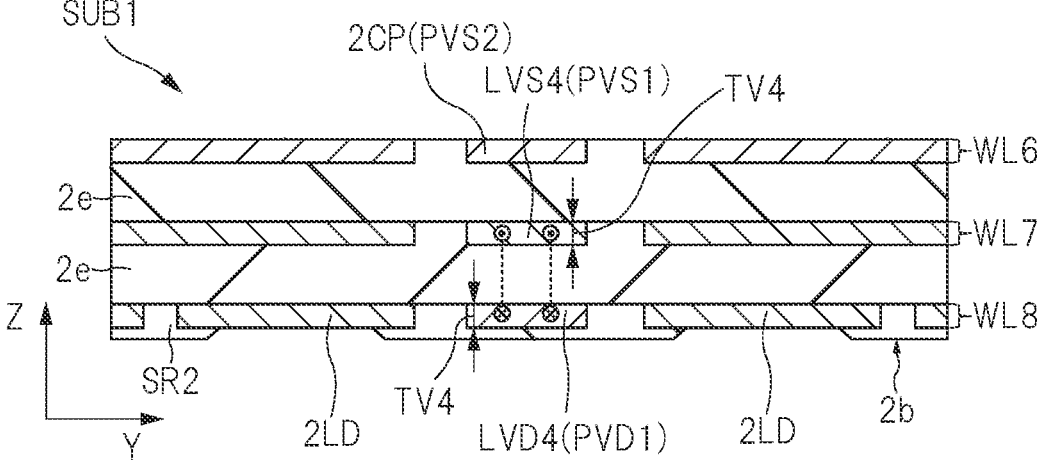
FIG. 10 is an enlarged cross-section view taken along line C-C of FIG. 9.

FIG. 9 is an enlarged plan view of another exemplary noise countermeasures for the power supply potential supplying paths and the reference potential supply paths illustrated in FIG. 6. FIG. 10 is an enlarged cross-section view taken along line C-C of FIG. 9. In the exemplary noise countermeasures illustrated in FIGS. 9 and 10, the power supply potential pattern LVD1 and the reference potential pattern LVS1 are separately arranged in adjacent wiring layers. If illustrations of the wiring layer WL7 and the wiring layer WL8 of FIG. 9 overlap with each other, the power supply potential pattern LVD4 and the reference potential pattern LVS4 are difficult to distinguish from each other. Thus, FIG. 9 needs to illustrate the wiring layer WL7 and the wiring layer WL8 in transparent plan view, but illustrates part of the wiring layer WL7 and part of the wiring layer WL8 overlapping therewith to be vertically arranged. FIG. 9 accurately illustrates positional relation among the power supply potential pattern LVD4, the reference potential pattern LVS4, and the lands 2LD in transparent plan view when the wiring substrate SUB1 is viewed from the lower surface 2b (see FIG. 10), and FIG. 9 can be regarded as a transparent plan view. Each of FIGS. 11, 14, 15, and 16 described later is also a diagram illustrating part of the wiring layer WL7 and part of the wiring layer WL8 overlapping therewith to be vertically arranged as similar to FIG. 9, and each of these drawings can be regarded as transparent plan view. Each of FIGS. 17 and 18 described later is a diagram illustrating part of the wiring layer WL6, part of the wiring layer WL7 overlapping therewith, and part of the wiring layer WL8 overlapping therewith to be vertically arranged as similar to FIG. 9, and each of these drawings can be regarded as transparent plan view.

Symbols in FIGS. 9 and 10 are given to schematically illustrate a state in which the power supply potential pattern LVD4 and the reference potential pattern LVS4 are inductively coupled.

The analog circuit AC1 of FIG. 5 is electrically connected with the power supply potential pattern LVD4 (see FIG. 9) capable of supplying the power supply potential VD1 to the analog circuit AC1 and the reference potential pattern LVS4 (see FIG. 9) capable of supplying the reference potential VS1 to the analog circuit AC1. The power supply potential pattern LVD4 illustrated in FIGS. 9 and 10 configures part of the power supply potential supplying path PVD1M of FIG. 5. The reference potential pattern LVS4 configures part of the reference potential supply path PVS1M of FIG. 5.

As illustrated in FIGS. 9 and 10, one of the power supply potential pattern LVD4 and the reference potential pattern LVS4 is provided in the wiring layer WL8, and another thereof is provided in the wiring layer WL7. Note that the example of FIGS. 9 and 10 shows that the power supply potential pattern LVD4 is provided in the wiring layer WL8 while the reference potential pattern LVS4 is provided in the wiring layer WL7. However, in a modification example, the reference potential pattern LVS4 may be provided in the wiring layer WL8 while the power supply potential pattern LVD4 may be provided in the wiring layer WL7.

The power supply potential pattern LVD4 and the reference potential pattern LVS4 extend in the same direction while mutually overlapping in transparent plan view. One pattern (that is the power supply potential pattern LVD4 in FIG. 10) of the power supply potential pattern LVD4 and the reference potential pattern LVS4, the pattern being arranged in the wiring layer WL8, is formed to extend with a width WV4. Another pattern (that is the reference potential pattern LVS4 in FIG. 10) being arranged in the wiring layer WL7 is similarly formed to extend with a width WV4.

In the case of the noise countermeasures of FIG. 10, the power supply potential pattern LVD4 and the reference potential pattern LVS4 face each other via the insulative layer $2e$ functioning as a dielectric body in the thickness direction of the wiring substrate SUB1 (in the Z direction in FIG. 10). Thus, the area of the facing part of the power supply potential pattern LVD4 and the reference potential pattern LVS4 can be made larger than in the example of FIGS. 7 and 8. In the example of FIG. 9, the width WV4 is, for example, about 50 to 200 μm, and is larger than a thickness TV4 (for example, about 10 to 20 μm) of the power supply potential pattern LVD4 and the reference potential pattern LVS4 illustrated in FIG. 10. Therefore, mutual induction between the power supply potential pattern LVD4 and the reference potential pattern LVS4 is larger than mutual induction between the power supply potential pattern LVD3 and the reference potential pattern LVS3 illustrated in FIG. 7. The thickness of the power supply potential pattern LVD1 and the reference potential pattern LVS1 illustrated in FIGS. 11 to 16, 18, and 19 described later is also, for example, about 10 to 20 μm as similar to the thickness TV4 of the power supply potential pattern LVD4 and the reference potential pattern LVS4 illustrated in FIG. 10.

The configuration of FIGS. 9 and 10 is effectively applicable particularly to the power supply potential supplying paths with a longer path distance such as the power supply potential supplying path PVD1M or the power supply potential supplying path PVD1L illustrated in FIG. 6. A configuration of FIGS. 12 and 13 described later is more effective to the power supply potential supplying path PVD1L of FIG. 6.

In the example of FIG. 9, in the wiring layer WL8, the power supply potential pattern LVD4 is arranged between two adjacent lands 2LD among the lands 2LD in the Y direction crossing with (orthogonal to, in FIG. 9) a direction in which the power supply potential pattern LVD4 extends (in the X direction in FIG. 9). The width WV4 is smaller than a center-to-center distance PLD between adjacent lands 2LD in the Y direction and is smaller than a separation distance GLD.

Third Noise Countermeasures

Figure 11:
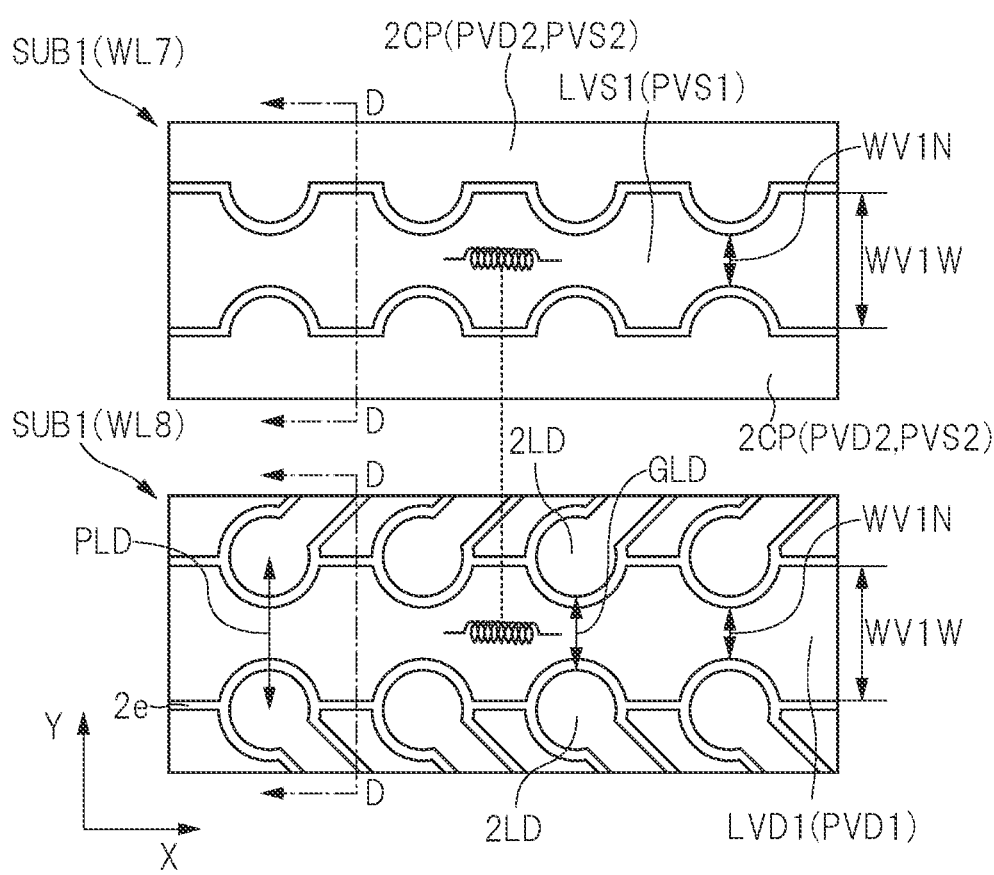
FIG. 11 is an enlarged plan view of still another exemplary noise countermeasures for the power supply potential supplying paths and the reference potential supply paths illustrated in FIG. 6.
Figure 12:
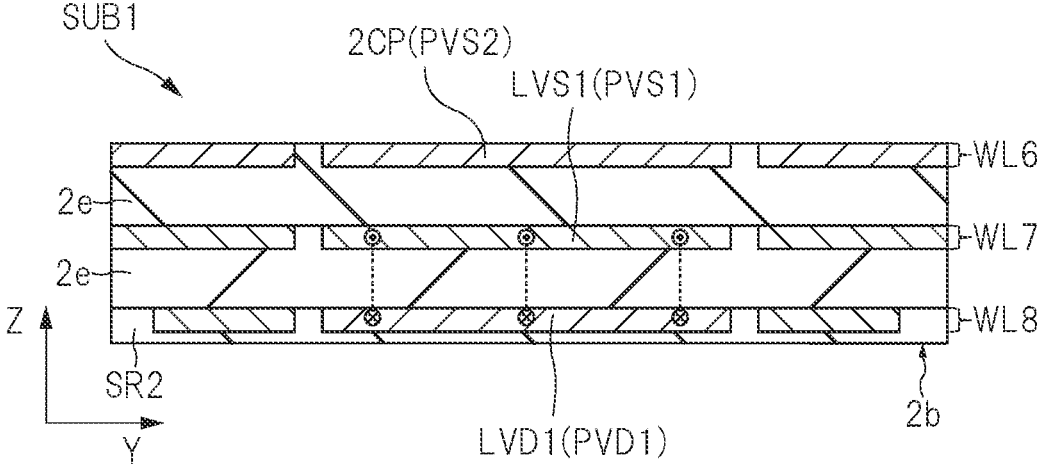
FIG. 12 is an enlarged cross-section view taken along line D-D of FIG. 11.
Figure 13:
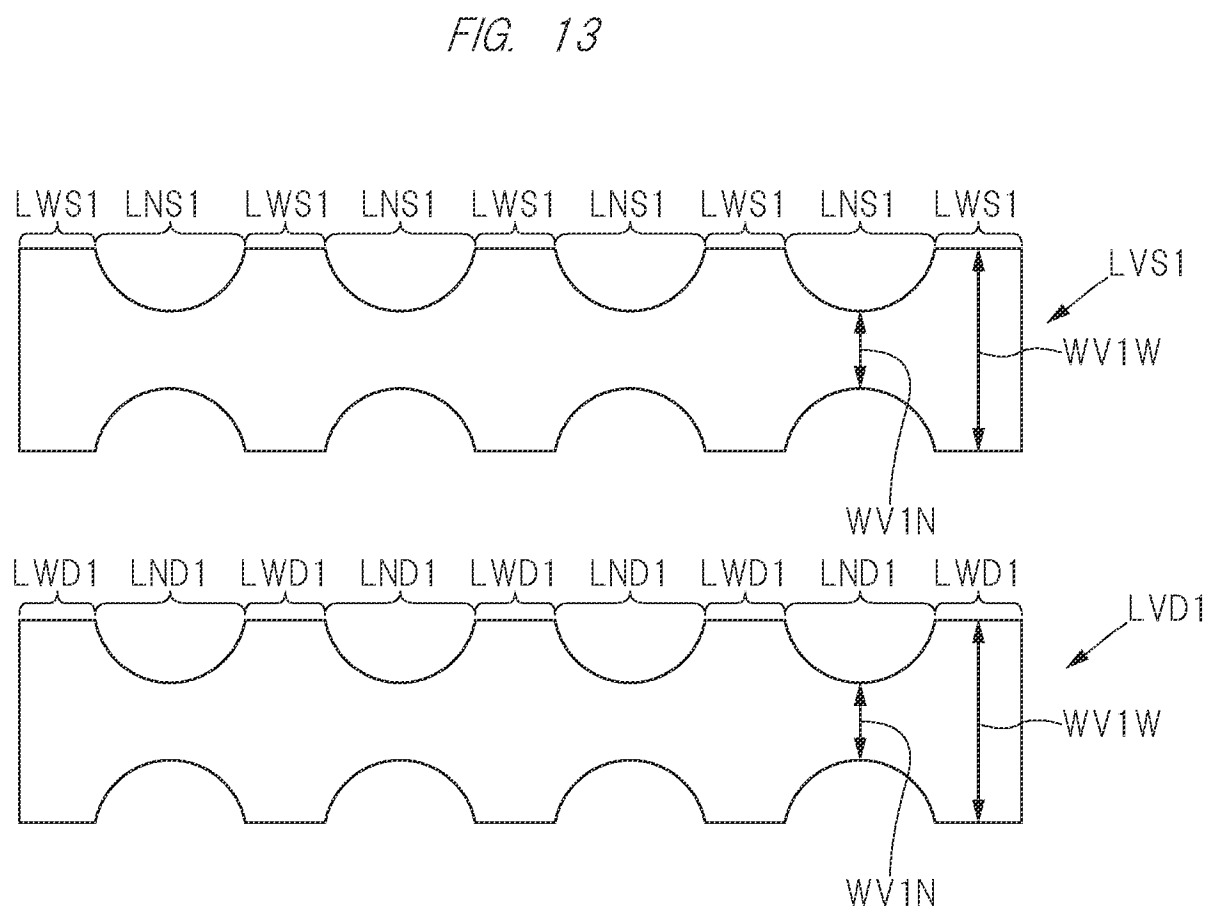

Next, noise countermeasure technique particularly effectively applicable to the power supply potential supplying path PVD1L illustrated in FIG. 6 will be described below as third noise countermeasures. FIG. 11 is an enlarged plan view of still another exemplary noise countermeasures for the power supply potential supplying paths and the reference potential supply paths illustrated in FIG. 6. FIG. 12 is an enlarged cross-section view taken along line D-D of FIG. 11. FIG. 13 is an enlarged plan view of only the power supply potential pattern and the reference potential pattern illustrated in FIG. 11. In the exemplary noise countermeasures illustrated in FIGS. 11 to 13, the power supply potential pattern LVD1 and the reference potential pattern LVS1 are separately arranged in adjacent wiring layers. Thus, FIG. 11 illustrates part of the wiring layer WL7 and part of the wiring layer WL8 overlapping therewith to be vertically arranged, as similar to FIG. 9. Symbols in FIGS. 11 and 12 are given to schematically illustrate a state in which the power supply potential pattern LVD1 and the reference potential pattern LVS1 are inductively coupled.

The analog circuit AC1 of FIG. 5 is electrically connected with the power supply potential pattern LVD1 (see FIG. 11) capable of supplying the power supply potential VD1 to the analog circuit AC1 and the reference potential pattern LVS1 (see FIG. 11) capable of supplying the reference potential VS1 to the analog circuit AC1. The power supply potential pattern LVD1 illustrated in FIGS. 11 and 12 configures part of the power supply potential supplying path PVD1L of FIG. 5. The reference potential pattern LVS1 configures part of the reference potential supply path PVS1L of FIG. 5.

As illustrated in FIGS. 11 and 12, one of the power supply potential pattern LVD1 and the reference potential pattern LVS1 is provided in the wiring layer WL8, and another thereof is provided in the wiring layer WL7. Note that the example of FIGS. 11 and 12 shows that the power supply potential pattern LVD1 is provided in the wiring layer WL8 while the reference potential pattern LVS1 is provided in the wiring layer WL7. However, in a modification example, the reference potential pattern LVS1 may be provided in the wiring layer WL8 while the power supply potential pattern LVD1 may be provided in the wiring layer WL7.

As illustrated in FIGS. 11 and 12, one of the power supply potential pattern LVD1 and the reference potential pattern LVS1 is provided in the wiring layer WL8 and another thereof is provided in the wiring layer WL7. The example of FIGS. 11 and 12 illustrates that the power supply potential pattern LVD1 is provided in the wiring layer WL8 and the reference potential pattern LVS1 is provided in the wiring layer WL7, but in a modification example, the reference potential pattern LVS1 may be provided in the wiring layer WL8 and the power supply potential pattern LVD1 may be provided in the wiring layer WL7.

As illustrated in FIG. 11, one pattern (the power supply potential pattern LVD1 in the example of FIG. 11) of the power supply potential pattern LVD1 and the reference potential pattern LVS1, the pattern being arranged in the wiring layer WL8, has a planar shape extending along the outer edges of the lands 2LD arranged adjacent to the power supply potential pattern LVD1 among the lands 2LD. The power supply potential pattern LVD1 includes a plurality of wide parts LWD1 (see FIG. 13) with a width WV1W in the Y direction crossing with (orthogonal to, in FIG. 11) a direction in which the power supply potential pattern LVD1 extends (in the X direction in FIG. 11), and a plurality of narrow parts LND1 (see FIG. 13) with a width WV1N smaller than the width WV1W in the Y direction.

As illustrated in FIG. 13, the wide parts LWD1 and the narrow parts LND1 are alternately arranged in the direction (the X direction) in which the power supply potential pattern LVD1 extends. As illustrated in FIG. 11, the width WV1W is larger than the separation distance GLD between adjacent lands 2LD via the power supply potential pattern LVD1 in the Y direction.

The narrow parts LND1 (see FIG. 13) and the wide parts LWD1 (see FIG. 13) overlap with one pattern (the reference potential pattern LVS1 in the example of FIG. 11) of the power supply potential pattern LVD1 and the reference potential pattern LVS1, the one pattern being arranged in the wiring layer WL7.

As illustrated in FIG. 12, in the case of the third noise countermeasures, by the existence of the wide parts LWD1, the area of the facing part of the power supply potential pattern LVD1 and the reference potential pattern LVS1 can be made larger than that of the second noise countermeasures of FIG. 10. In the example of FIG. 11, the width WV1W is, for example, about 200 to 800 μm, and is larger than the width WV4 of the power supply potential pattern LVD4 and the reference potential pattern LVS4 illustrated in FIG. 9. Thus, mutual induction between the power supply potential pattern LVD1 and the reference potential pattern LVS1 is much larger than mutual induction between the power supply potential pattern LVD4 and the reference potential pattern LVS4 illustrated in FIGS. 9 and 10. Therefore, even when the third noise countermeasures of FIGS. 11 to 13 are applied to a path with the path distance DVDL (or path distance DVSL) of 7 mm or more such as the power supply potential supplying path PVD1L or the reference potential supply path PVS1L illustrated in FIG. 6, the influence of noise on the power supply potential supplying path PVD1L can be reduced.

As illustrated as the ranges of the wide parts LWD1 and the narrow parts LND1 in FIG. 13, the wide part LWD1 is defined as a part in the power supply potential pattern LVD1 which extends with a width WV1W that can be substantially regarded to be constant. The width WV1W is wider (larger) than the separation distance GLD between adjacent lands 2LD. In this manner, since the wide parts LWD1 with the width WV1W larger than the separation distance GLD are provided, the third noise countermeasures of FIGS. 11 and 12 can provide higher noise reduction effects than those of the second noise countermeasures of FIGS. 9 and 10.

In the example of FIG. 11, the width WV1W is narrower (smaller) than the center-to-center distance PLD between adjacent lands 2LD in the Y direction. In a modification example described below, the width WV1W may be wider (larger) than the center-to-center distance PLD between adjacent lands 2LD in the Y direction.

The narrow part LND1 is defined as a part with a width smaller than the width WV1W. Therefore, the width of the narrow part LND1 is not always constant as illustrated in FIG. 13. The smallest width WV1N in the widths of the narrow parts LND1 is smaller than the separation distance GLD between adjacent lands of FIG. 11. As illustrated in FIG. 11, the narrow part LND1 (see FIG. 13) includes a wider part than the separation distance GLD between adjacent lands 2LD. A shape of the narrow part LND1 is determined by a shape of a conductor pattern such as the land 2LD adjacent to the power supply potential pattern LVD1. Therefore, the shape of the narrow part LND1 of FIG. 13 is exemplary, and may be variously modified. However, the power supply potential pattern LVD1 is arranged to extend between adjacent lands 2LD in the Y direction, and thus each of the narrow parts LND1 includes at least a part with a width WV1N narrower (smaller) than the separation distance GLD between adjacent lands 2LD.

Next, a shape of the reference potential pattern LVS1 arranged in the wiring layer WL7 to face the power supply potential pattern LVD1 arranged in the wiring layer WL8 will be described. As illustrated in FIG. 13, in the present embodiment, the power supply potential pattern LVD1 and the reference potential pattern LVS1 have a similar planar shape.

More specifically, one pattern (the reference potential pattern LVS1 in the example of FIG. 11) of the power supply potential pattern LVD1 and the reference potential pattern LVS1, the one pattern being arranged in the wiring layer WL7, is formed to imitate a shape of a pattern (the power supply potential pattern LVD1 in the example of FIG. 11) formed in the wiring layer WL8 in transparent plan view.

A plurality of wide parts LWS1 (see FIG. 13) with the width WV1W and a plurality of narrow parts LNS1 (see FIG. 13) with a width (such as the width WV1N) smaller than the width WV1W are provided in the Y direction crossing with (orthogonal to, in FIG. 11) a direction (X direction) in which the reference potential pattern LVS1 extends. The wide parts LWS1 and the narrow parts LNS1 are alternately arranged in the direction (X direction) in which the reference potential pattern LVS1 extends. In transparent plan view, the narrow parts LND1 and the narrow parts LNS1 overlap with each other, and the wide parts LWD1 and the wide parts LWS1 overlap with each other.

Note that the definition of the wide part LWS1 is applicable to the definition of the wide part LWD1 by replacing the power supply potential pattern LVD1 with the reference potential pattern LVS1. Similarly, the definition of the narrow part LNS1 is applicable to the definition of narrow part LND1 by replacing the power supply potential pattern LVD1 with the reference potential pattern LVS1.

In this manner, the reference potential pattern LVS1 and the power supply potential pattern LVD1 mostly face each other when the planar shape of the reference potential pattern LVS1 and the planar shape of the power supply potential pattern LVD1 are the same as each other, when the narrow parts LND1 and the narrow parts LNS1 overlap with each other, and when the wide parts LWD1 and the wide parts LWS1 overlap with each other. This case is particularly favorable because of enabling a path through which the noise enter from other power supply paths or signal transmission paths to be made smaller.

In the example of FIG. 11, the phrase "formed to imitate" means that the reference potential pattern LVS1 and the power supply potential pattern LVD1 are formed in the same shape. However, this does not exclude slight differences in shape due to processing accuracy. For example, the shape of the reference potential pattern LVS1 and the shape of power supply potential pattern LVD1 may partially not be the same due to limitation in layout of the wiring layer WL7 or the wiring layer WL8. In other words, the meaning of "formed to imitate" is not limited to perfect matching between the shape of the reference potential pattern LVS1 and the shape of the power supply potential pattern LVD1 in all the paths. Even in this case, if the shape of the reference potential pattern LVS1 partially matches with that of the power supply potential pattern LVD1, the effects of the noise countermeasures described in the present section are achieved at the matched part.

However, preferably, 80% or more of all the paths in the reference potential pattern LVS1 and 80% or more of all the paths in the power supply potential pattern LVD1 are formed in the same shape and are arranged to overlap with each other. All the paths in the reference potential pattern LVS1 described here are defined as paths from one end of the reference potential pattern LVS1 (a via land connected to a via wiring not illustrated) to the other end thereof (a via 2LD connected to the reference potential pattern LVS1). All the paths in the power supply potential pattern LVD1 are defined as paths from one end of the power supply potential pattern LVD1 (a via land connected to a via wiring not illustrated)

to the other end thereof (a via 2LD connected to the power supply potential pattern LVD1).

The phrase "A is formed to imitate B" in the following description is used in the same meaning unless otherwise interpretation with different meaning is particularly described.

Although not illustrated, in a modification example of the example of FIGS. 11 and 13, the planar shape of the reference potential pattern LVS1 formed in the wiring layer WL7 may be a belt shape with the width WV1W extending in the Y direction. Even in this case, the power supply potential pattern LVD1 of FIGS. 11 and 13 mostly faces the reference potential pattern LVS1, and thus this case is effective for countermeasures of reducing noise components entering the power supply potential pattern LVD1. However, in this case, part of the reference potential pattern LVS1 overlaps with a conductor pattern (such as land 2LD) other than the power supply potential pattern LVD1. The reference potential pattern LVS1 is preferably formed to imitate the shape of the power supply potential pattern LVD1 as illustrated in FIGS. 11 and 13 in a viewpoint of suppressing the noise components from entering the reference potential pattern LVS1 formed in the wiring layer WL7 from the land 2LD.

Modification Examples of Third Noise Countermeasures

Figure 14:
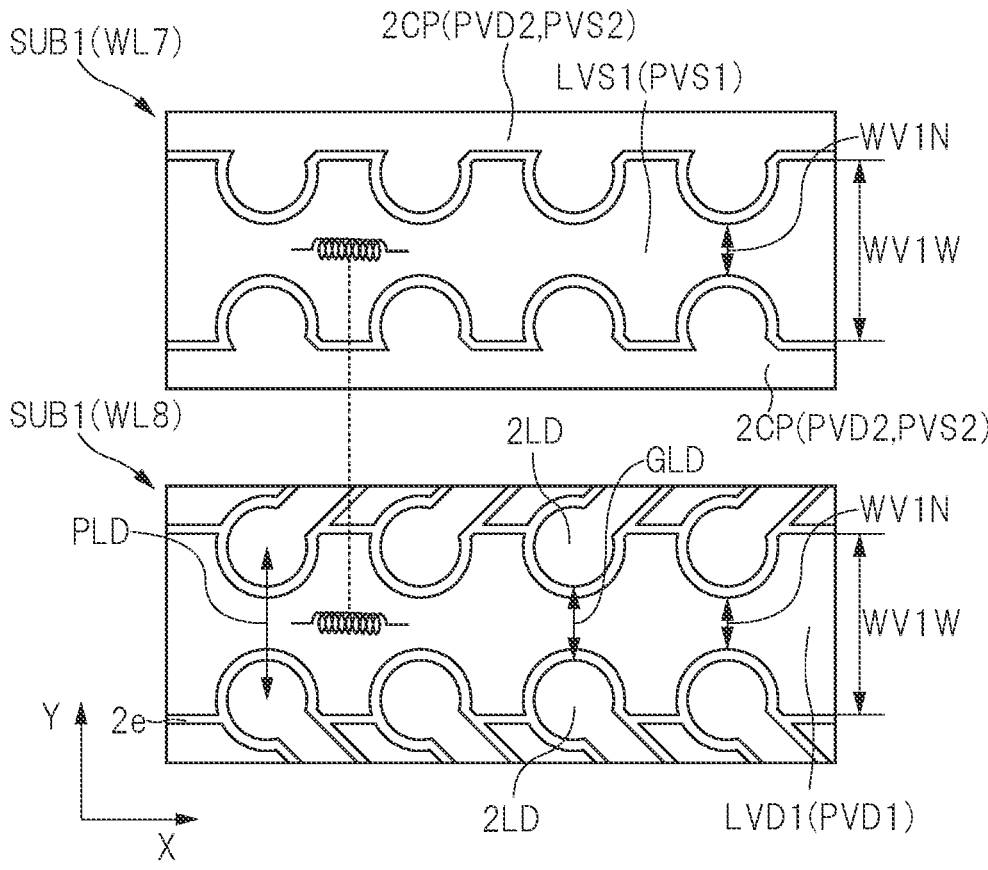
FIG. 14 is an enlarged plan view of still another exemplary noise countermeasures for the power supply potential supplying paths and the reference potential supply paths illustrated in FIG. 6.

Next, modification examples of the third noise countermeasures described in FIGS. 11 to 13 will be described. FIG. 14 is an enlarged plan view of still another exemplary noise countermeasures for the power supply potential supplying paths and the reference potential supply paths illustrated in FIG. 6. Symbols in FIG. 14 are given to schematically illustrate a state in which the power supply potential pattern LVD1 and the reference potential pattern LVS1 are inductively coupled. In the following modification examples, only the enlarged plan view of FIG. 11 is used, the enlarged cross-section view of FIG. 12 and the enlarged plan view of FIG. 13 are omitted, and FIGS. 12 and 13 are used for description as needed.

The modification example of FIG. 14 is different from the example of FIG. 11 in that the width WV1W of the wide parts LWD1 (see FIG. 13) in the power supply potential pattern LVD1 and the width WV1W of the wide parts LWS1 (see FIG. 13) in the reference potential pattern LVS1 are much larger. The lands 2LD are arranged at equal intervals both in the example of FIG. 9 and the example of FIG. 14. In the example of FIG. 14, the width WV1W is larger than the center-to-center distance PLD between adjacent lands 2LD among the lands 2LD via the power supply potential pattern LVD1 in the Y direction.

In the modification example of FIG. 14, the path width of the facing part of the power supply potential pattern LVD1 and the reference potential pattern LVS1 can be made much larger than in the example of FIG. 11. Thus, an effect of reducing noise components from entering the power supply potential pattern LVD1 or the reference potential pattern LVS1 is much larger than in the example of FIG. 11.

On the other hand, in the example of FIG. 14, the area of the power supply potential pattern LVD1 arranged between the lands 2LD is large, and thus the example of FIG. 11 is more favorable in a viewpoint of increasing a degree of freedom in designing the drawn wirings connected to the lands 2LD, in other words, a degree of freedom in designing the wiring layer WL8. That is, in the example of FIG. 11, the width WV1W is smaller than the center-to-center distance PLD between adjacent lands 2LD among the lands 2LD via the power supply potential pattern LVD1 in the Y direction. In this case, a degree of freedom in designing the wiring layer WL8 can be made higher than in the modification example of FIG. 14.

Figure 15:
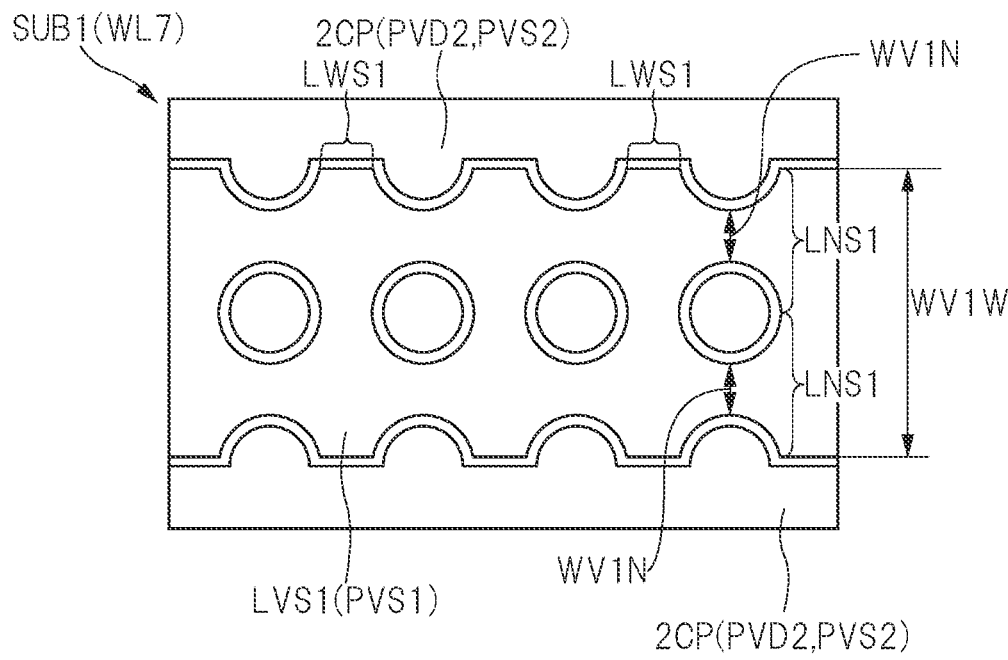
FIG. 15 is an enlarged plan view of another modification example of FIG. 11.
Figure 15:
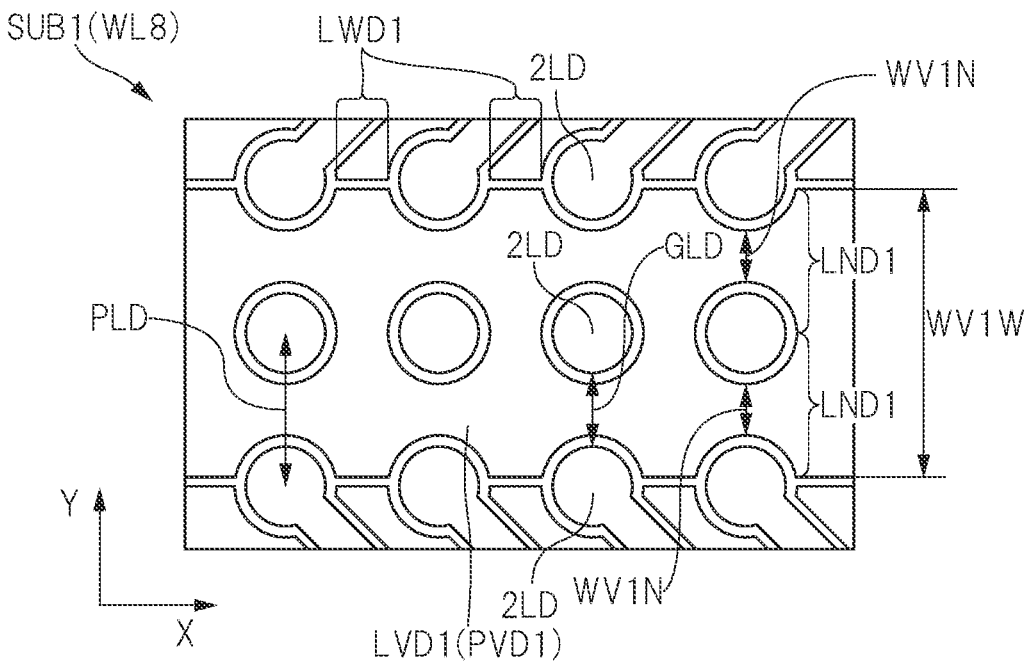
Figure 16:
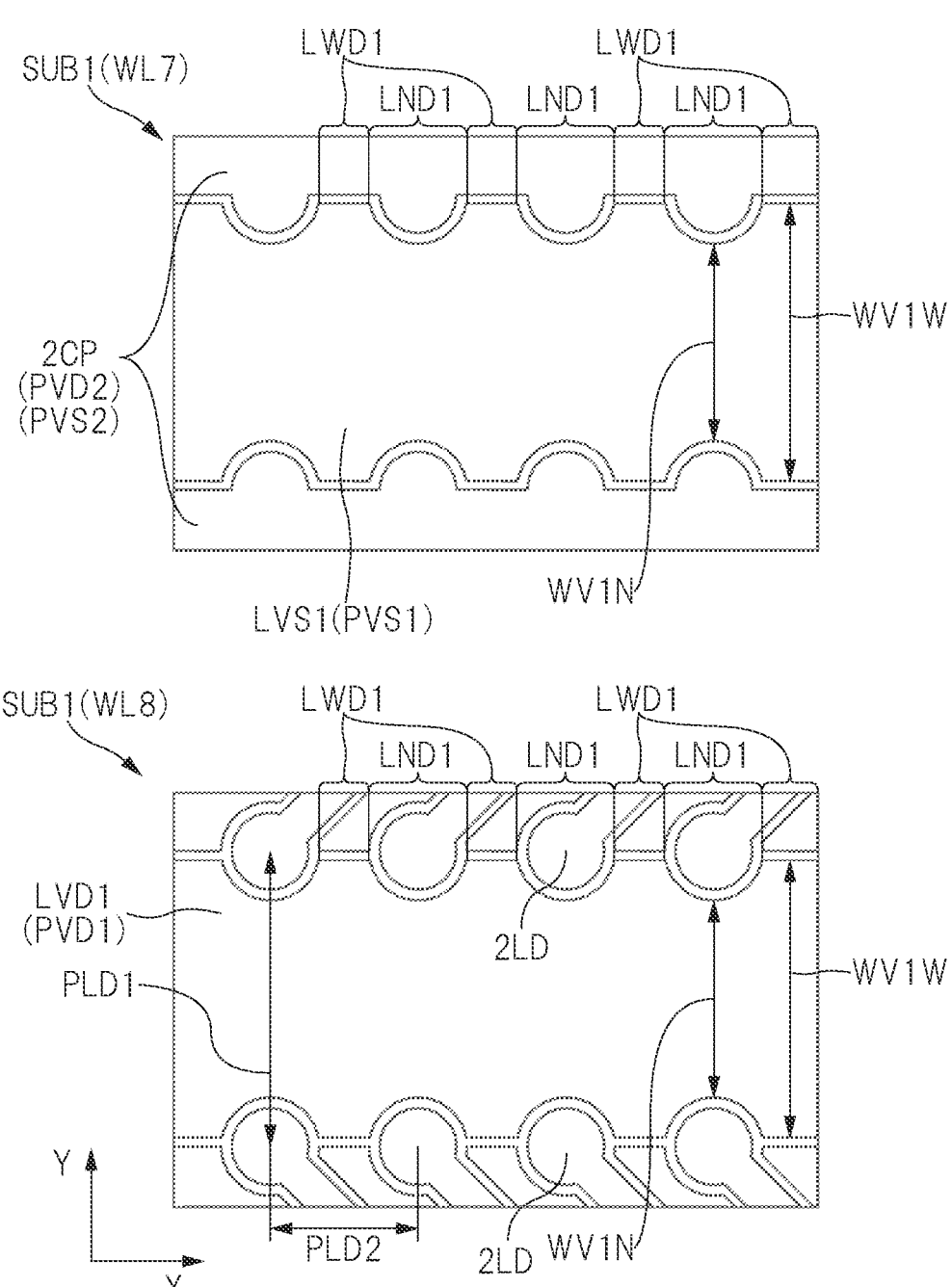
FIG. 16 is an enlarged plan view of still another modification example of FIG. 11.

FIG. 15 is an enlarged plan view of still another modification example of FIG. 11. In FIGS. 15 and 16, symbols that are given to schematically illustrate a state in which the power supply potential pattern LVD1 and the reference potential pattern LVS1 are inductively coupled are omitted. The modification example of FIG. 15 is different from the example of FIG. 11 in that some of the lands 2LD are at positions surrounded by the power supply potential pattern LVD1. In the modification example of FIG. 15, the area of the facing part of the power supply potential pattern LVD1 and the reference potential pattern LVS1 can be made much larger than in the modification example of FIG. 14. Thus, the effect of reducing noise components entering the power supply potential pattern LVD1 or the reference potential pattern LVS1 is much larger than in the example of FIG. 14.

In the modification example of FIG. 15, a plurality of (two in FIG. 15) adjacent narrow parts LND1 are provided via the land 2LD in the Y direction. Although not illustrated, the width WV1W of the wide part LWD1 in the power supply potential pattern LVD1 can be made much larger.

On the other hand, as described above, the example of FIG. 11 is more favorable in a viewpoint of increasing a degree of freedom in designing the wiring layer WL8. For example, in the example of FIG. 15, it is necessary to connect the via wirings to overlap with the lands 2LD in order to electrically connect other wiring layer and the lands 2LD surrounded by the power supply potential pattern LVD1.

FIG. 16 is an enlarged plan view of still another modification example of FIG. 11. The modification example of FIG. 16 is different from the examples of FIGS. 9, 11, 14, and 15 in an arrangement pattern of the lands 2LD. In the example of FIG. 16, the center-to-center distance PLD1 between adjacent lands 2LD among the lands 2LD via the power supply potential pattern LVD1 is larger than a center-to-center distance PLD2 between adjacent lands 2LD in the direction (X direction in FIG. 16) in which the power supply potential pattern LVD1 extends. The minimum width (that is the width WV1N) of the narrow part LWD1 is larger than the center-to-center distance PLD2.

The modification example of FIG. 16 has a structure in the modification example of FIG. 15 without the land 2LD surrounded by the power supply potential pattern LVD1. This structure enables the path width of the facing part of the power supply potential pattern LVD1 and the reference potential pattern LVS1 to be much larger than in the modification example of FIG. 15. Thus, the effect of reducing noise components entering the power supply potential pattern LVD1 or the reference potential pattern LVS1 can be much larger than in the example of FIG. 15.

A decrease in the number of terminals due to the application of the modification example of FIG. 16 can be suppressed when part of the power supply potential pattern LVD1 is used for lands 2LD in the modification example of FIG. 16 (or when solder balls SB (see FIG. 4) are connected to the power supply potential pattern LVD1 exposed from openings formed in the insulative film SR2 (see FIG. 4) covering the power supply potential pattern LVD1.

The modification examples of FIGS. 14, 15, and 16 illustrate that the reference potential pattern LVS1 arranged in the wiring layer WL7 has the same planar shape as the power supply potential pattern LVD1 arranged in the wiring layer WL8. However, as described above, in a modification example, the planar shape of the reference potential pattern LVS1 formed in the wiring layer WL7 may be a belt shape with the width WV1W extending in the Y direction. In still another modification example of the examples of FIGS. 14, 15, and 16, the reference potential pattern LVS1 may be arranged in the wiring layer WL8 while the power supply potential pattern LVD1 may be arranged in the wiring layer WL7.

Noise Countermeasures Using Electromagnetic Shield

Figure 17:
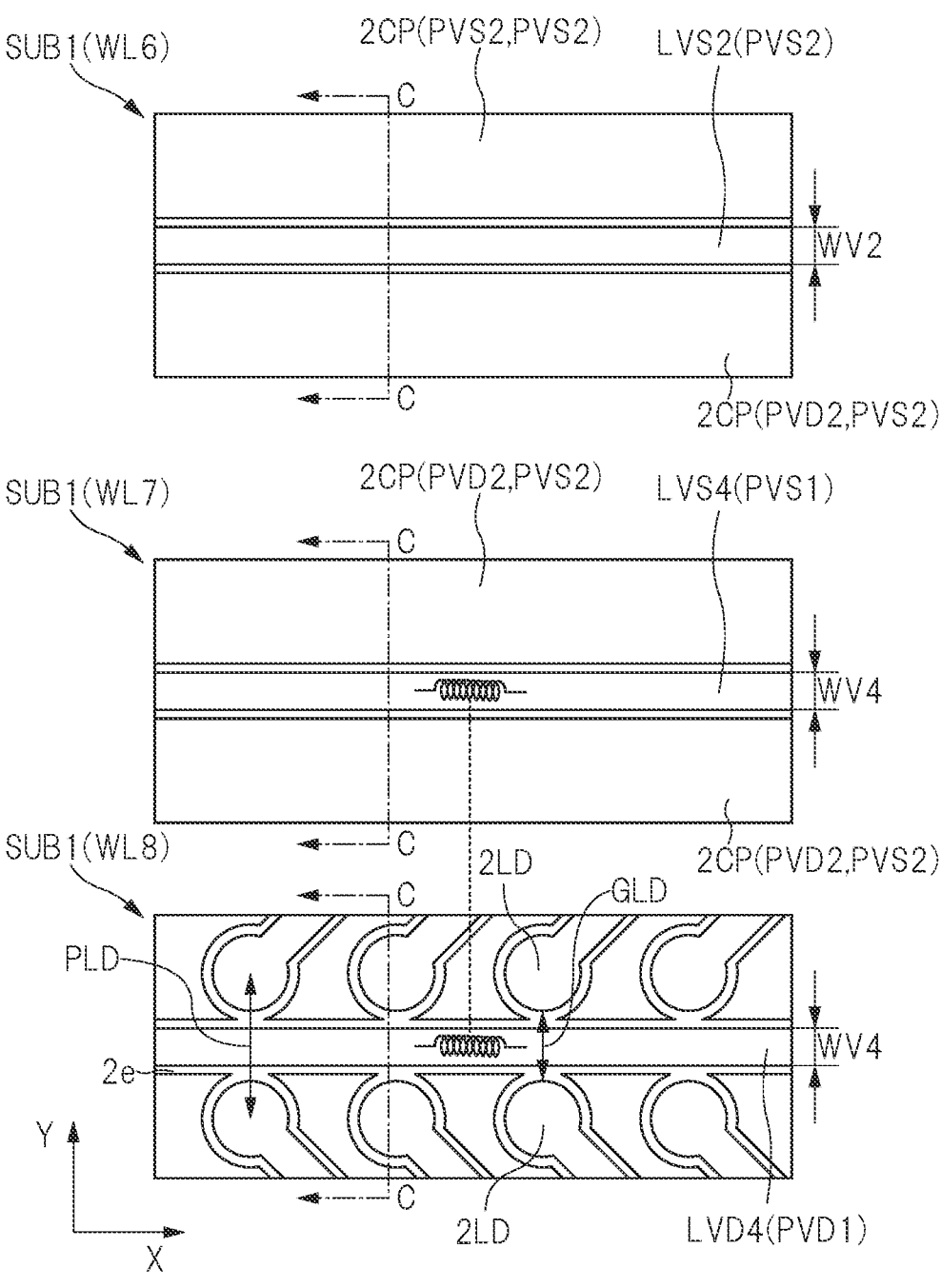
FIG. 17 is an enlarged plan view of an exemplary shape of a conductor pattern formed in the third wiring layer from the lowermost wiring layer illustrated in FIG. 10.

As a more favorable aspect than those of the noise countermeasures described in FIGS. 7 to 16, a modification example in which a conductor pattern functioning as an electromagnetic shield is arranged at the overlapping position between the power supply potential pattern LVD1 and the reference potential pattern LVS1 will be described. FIG. 17 is an enlarged plan view of an exemplary shape of a conductor pattern formed in the third wiring layer counted from the lowermost wiring layer illustrated in FIG. 10. The wiring layer WL6 is the next nearest to the lower surface 2b (see FIG. 4) after the wiring layer WL7. The enlarged cross-section view taken along line C-C of FIG. 17 is similar to that of FIG. 10, and thus the repeated illustration thereof is omitted. Symbols in FIG. 17 are given to schematically illustrate a state in which the power supply potential pattern LVD1 and the reference potential pattern LVS1 are inductively coupled.

The wiring substrate SUB1 described in FIG. 5 includes the reference potential pattern LVS2 (see FIG. 17) capable of supplying the reference potential VS2 to a circuit (such as the core circuit CC1) other than the analog circuit AC1. As illustrated in FIG. 10, the wiring layers in the wiring substrate SUB1 include the wiring layer WL6 provided to be the next nearest to the lower surface 2b after the wiring layer WL7. As illustrated in FIG. 17, the reference potential pattern LVS2 is provided in the wiring layer WL6, and overlaps with the power supply potential pattern LVD4 and the reference potential pattern LVS4. The reference potential pattern LVS2 arranged to overlap with the power supply potential pattern LVD4 and the reference potential pattern LVS4 functions as an electromagnetic shield, and thus noise components are prevented from entering the power supply potential pattern LVD4 and the reference potential pattern LVS4 from other conductor pattern.

Incidentally, a power supply potential pattern (not illustrated) capable of supplying the power supply potential VD2 to a circuit (such as the core circuit CC1) other than the analog circuit AC1 may be used instead of the reference potential pattern LVS2 of FIG. 17. However, the reference potential pattern LVS2 is a conductor pattern which configures part of the reference potential supply path PVS2 configured to supply a reference potential to many circuits other than the analog circuit AC1 and which has the smallest self-noise among the conductor patterns included in the wiring substrate SUB1. Thus, particularly, the reference potential pattern LVS2 is preferably used for the conductor pattern used as the electromagnetic shield.

In the example of FIG. 17, the power supply potential pattern LVD4, the reference potential pattern LVS4, and the reference potential pattern LVS2 extend in the same direction while mutually overlapping in transparent plan view. The width WV2 of the reference potential pattern LVS2 is the same as the width WV4 of the power supply potential pattern LVD4 and the width WV4 of the reference potential pattern LVS4. In other words, the reference potential pattern LVS2 has the same planar shape as those of the power supply potential pattern LVD4 and the reference potential pattern LVS4. In a modification example of the example of FIG. 17, the large-area reference potential pattern LVS2 overlapping with the conductor patterns 2CP arranged at both sides of the reference potential pattern LVS4 may be also provided in addition to the reference potential pattern LVS4 arranged in the wiring layer WL7 in FIG. 17.

When a potential supplied to the conductor patterns 2CP arranged at both sides of the reference potential pattern LVS2 in the wiring layer WL6 of FIG. 17 is a potential (or signal) other than the reference potential VS2 of FIG. 5, a degree of freedom in the layout of the wiring layer WL6 is improved by minimizing the shape of the reference potential pattern LVS2 enough to function as the electromagnetic shield.

Figure 18:
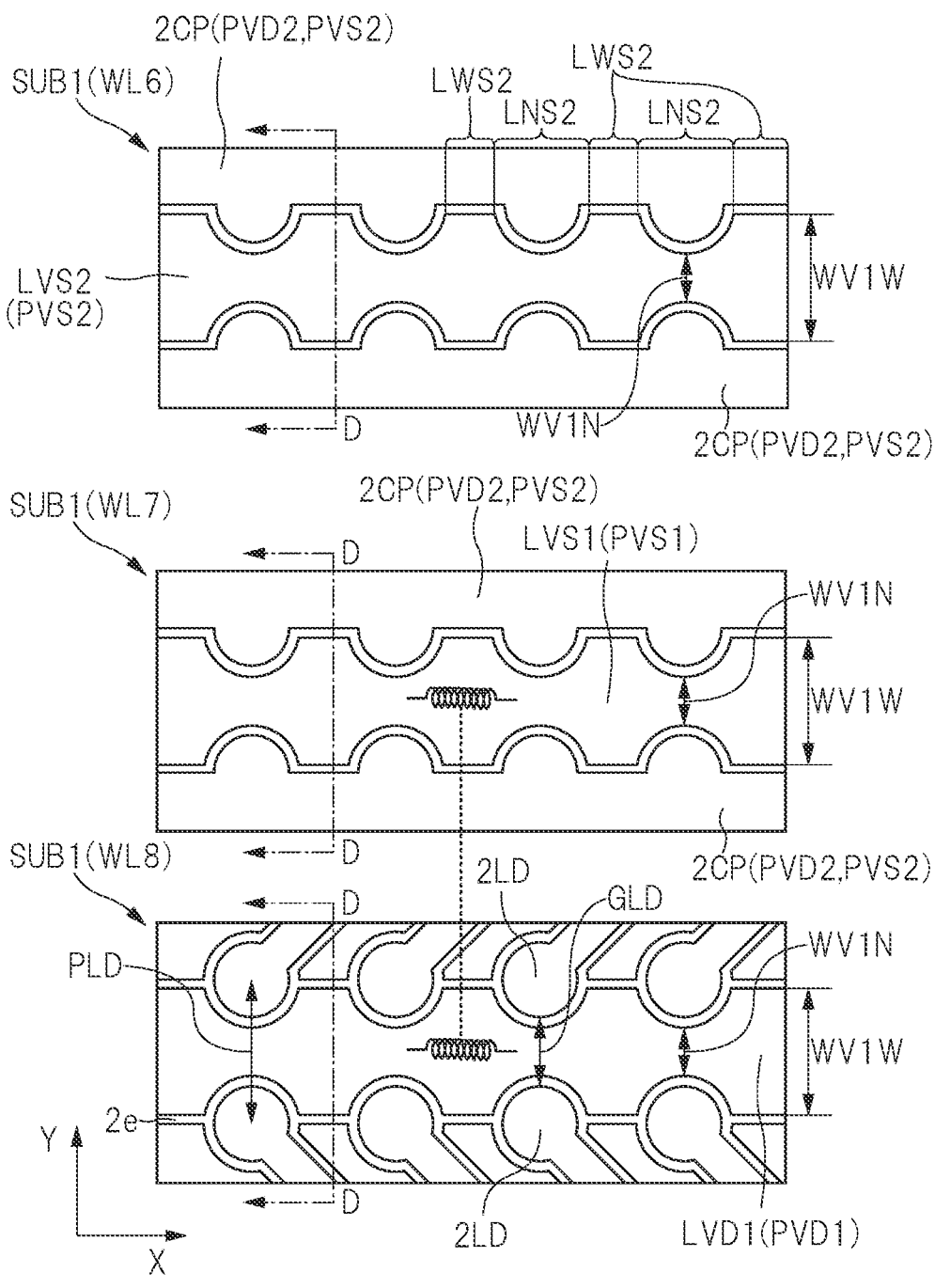
FIG. 18 is an enlarged plan view of an exemplary shape of a conductor pattern formed in the third wiring layer ordered from the lowermost wiring layer illustrated in FIG. 12.

FIG. 18 is an enlarged plan view of an exemplary shape of a conductor pattern formed in the third wiring layer counted from the lowermost wiring layer illustrated in FIG. 12. The wiring layer WL6 is the next nearest to the lower surface 2b (see FIG. 4) after the wiring layer WL7. The enlarged cross-section view taken along line D-D of FIG. 18 is similar to that of FIG. 12, and thus the repeated illustration thereof is omitted.

The electromagnetic shield described in FIG. 17 is applicable in combination with the structure described in FIGS. 11 to 13. As illustrated in FIG. 18, the reference potential pattern LVS2 is provided in the wiring layer WL6, and overlaps with the power supply potential pattern LVD1 and the reference potential pattern LVS1. The reference potential pattern LVS2 arranged to overlap with the power supply potential pattern LVD1 and the reference potential pattern LVS1 functions as an electromagnetic shield, and thus noise components can be prevented from entering the power supply potential pattern LVD1 and the reference potential pattern LVS1 from other conductor pattern.

In the example of FIG. 18, the wide parts LWD1 (see FIG. 13) and the narrow parts LND1 (see FIG. 13) in the power supply potential pattern LVD1, and the wide parts LWS1 (see FIG. 13) and the narrow parts LNS1 (see FIG. 13) in the reference potential pattern LVS1 overlap with the reference potential pattern LVS2 formed in the wiring layer WL6.

In a modification example of the example of FIG. 18, the large-area reference potential pattern LVS2 overlapping with the conductor patterns 2CP arranged at both sides of the reference potential pattern LVS1 may be provided in addition to the reference potential pattern LVS1 arranged in the wiring layer WL7 of FIG. 18. In the example of FIG. 18, the planar shape of the reference potential pattern LVS2 arranged in the wiring layer WL6 is the same as the planar shape of the reference potential pattern LVS1 arranged in the wiring layer WL7 and the planar shape of the power supply potential pattern LVD1 arranged in the wiring layer WL8. The reference potential pattern LVS2, the reference potential pattern LVS1, and the power supply potential pattern LVD1 extend in the same direction while mutually overlapping in transparent plan view.

More specifically, the reference potential pattern LVS2 formed in the wiring layer WL6 is formed to imitate the shape of the power supply potential pattern LVD1 formed in the wiring layer WL8 in transparent plan view. A plurality of wide parts LWS2 with the width WV1W and a plurality of narrow parts LNS2 with a width smaller than the width WV1W are provided in the Y direction crossing with (orthogonal to, in FIG. 18) a direction (X direction) in which the reference potential pattern LVS2 extends. The wide parts LWS2 and the narrow parts LNS2 are alternately arranged in the direction (X direction) in which the reference potential pattern LVS2 extends. In transparent plan view, The narrow parts LND1 and the narrow parts LNS2 mutually overlap and the wide parts LWD1 and the wide parts LWS2 mutually overlap.

As illustrated in FIG. 18, a degree of freedom in the layout of the wiring layer WL6 is improved by minimizing the shape of the reference potential pattern LVS2 enough to function as an electromagnetic shield.

The embodiments using the reference potential pattern LVS2 as the electromagnetic shield has been described while FIGS. 17 and 18 are referred to as the representative examples. However, the reference potential pattern LVS2 described in FIGS. 17 and 18 may be arranged in the wiring layer WL6 (see FIG. 4) in each structure described in FIGS. 14, 15, and 16. In this case, noise components can be suppressed from entering the power supply potential pattern LVD1 and the reference potential pattern LVS1 illustrated in FIGS. 14, 15, and 16 from other conductor pattern.

Pattern Width

Figure 19:
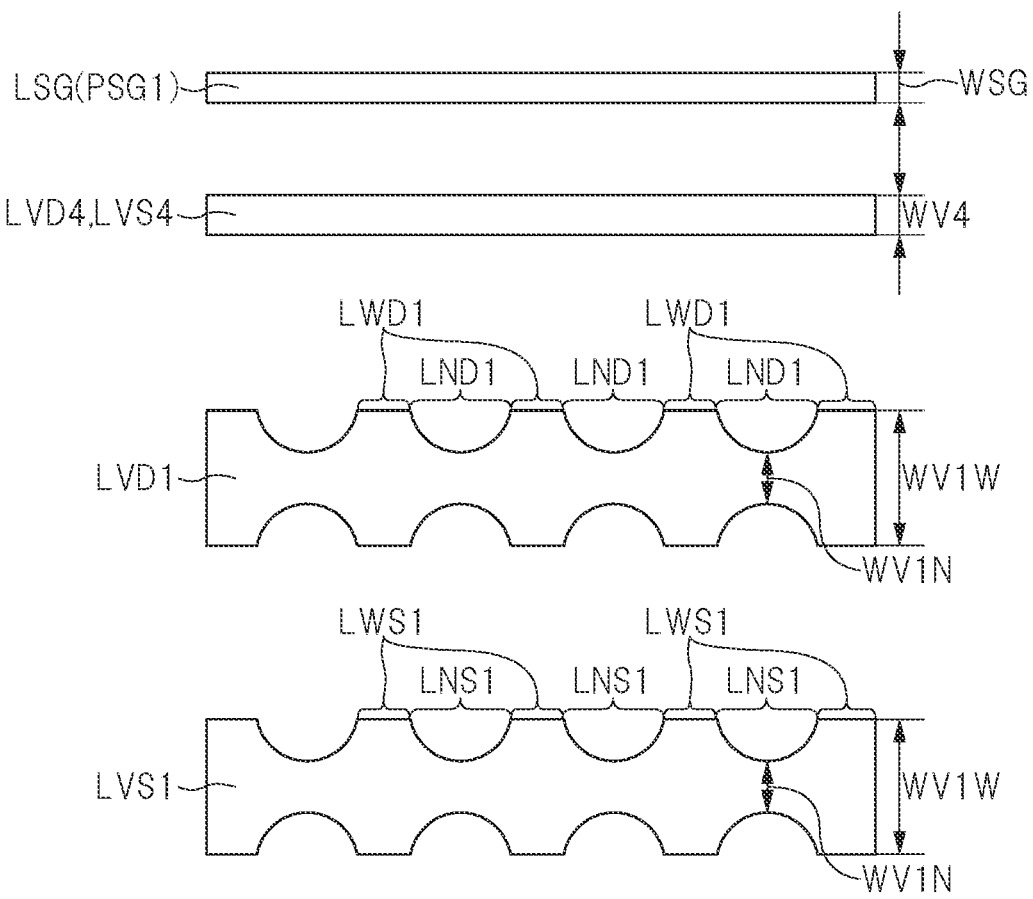
FIG. 19 is a plan view to compare in difference between a width of a signal wiring configured to transmit an electric signal to the analog circuit illustrated in FIG. 5 and wiring widths of a reference potential pattern and a power supply potential pattern illustrated in FIG. 9 or FIG. 11.

Next, the widths of the reference potential pattern LVS1, the reference potential pattern LVS4, the power supply potential pattern LVD1, and the power supply potential pattern LVD4 described in FIGS. 9 to 18 will be described. FIG. 19 is a plan view to compare the width of the signal wiring configured to transmit an electric signal to the analog circuit illustrated in FIG. 5, and the widths of the wirings of the reference potential pattern and the power supply potential pattern illustrated in FIG. 9 or 11.

The wiring substrate SUB1 of FIG. 5 includes a wiring (signal wiring, signal wiring pattern) LSG (see FIG. 19) configuring part of the signal transmission path PSG1 configured to transmit a signal (electric signal) SG1 to the analog circuit AC1. In other words, the analog circuit AC1 is electrically connected with the wiring (signal wiring, signal wiring pattern) LSG capable of transmitting an electric signal to the analog circuit AC1. As illustrated in FIG. 19, the width WV4 of the power supply potential pattern LVD4 and the width WV4 of the reference potential pattern LVS4, which are described in FIG. 9, are larger than the wiring width WSG of the wiring LSG. Similarly, the minimum width WV1N of the power supply potential pattern LVD1 and the minimum width WV1N of the reference potential pattern LVS1, which are described in FIG. 11, are larger than the wiring width WSG of the wiring LSG. Even when the conductor pattern configured to supply power to the analog circuit AC1 extends as described above, its width is larger than the wiring width WSG of the wiring LSG. Thus, as described above, mutual induction can be increased by overlapping the power supply potential pattern LVD1 and the reference potential pattern LVS1 in the thickness direction or overlapping the power supply potential pattern LVD4 and the reference potential pattern LVS4 in the thickness direction, and thus, the effect of reducing the entering noise can be enhanced.

Separation Distance Between Patterns

Figure 20:
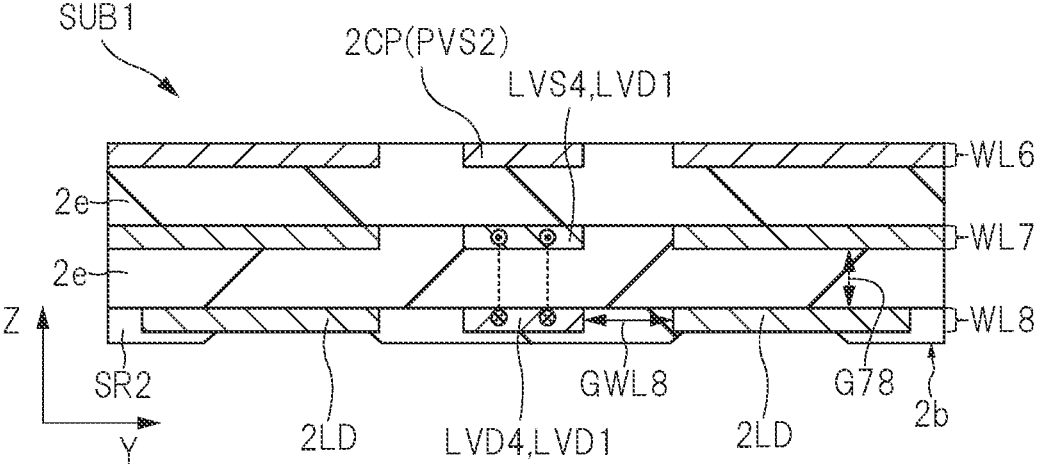
FIG. 20 is an enlarged cross-section view of a modification example of FIG. 10 or FIG. 12.

Next, a separation distance between patterns illustrated in FIGS. 10 and 20 will be described. FIG. 20 is an enlarged cross-section view of a modification example of the example of FIG. 10 or 12. The noise countermeasures and their modification examples described in FIGS. 7 to 16 are techniques of reducing the noise components entering the paths by inductively coupling a power supply potential supplying path and a reference potential supply path connected to the analog circuit. However, the noise is preferably suppressed from entering the power supply paths in a viewpoint of stabilizing the power supply to the analog circuit.

In the example of FIG. 20, a separation distance GWL8 between the power supply potential pattern LVD1 (or the power supply potential pattern LVD4) arranged in the wiring layer WL8 and the land 2LD is larger than an interlayer distance G78 between the wiring layer WL7 and the wiring layer WL8. The interlayer distance G78 can be also regarded as a separation distance between the conductor pattern arranged in the wiring layer WL8 and the conductor pattern arranged in the wiring layer WL7 in the thickness direction. When the separation distance GWL8 is made larger than the interlayer distance G78, the noise components can be prevented from entering, and the mutual induction can be increased.

In the foregoing, the invention made by the inventors of the present application has been concretely described on the basis of the embodiments. However, it is needless to say that the present invention is not limited to the foregoing embodiments, and various modifications can be made within the scope of the present invention.

What is claimed is:

1. A semiconductor device comprising:
   a wiring substrate having an upper surface, a lower surface opposite the upper surface, and a plurality of wiring layers provided between the upper surface and the lower surface; and
   a semiconductor chip having a first surface, a plurality of bump electrodes formed on the first surface, and a second surface opposite the first surface, the semiconductor chip being mounted on the upper surface of the wiring substrate via the plurality of bump electrodes,
   wherein the semiconductor chip includes a first analog circuit,
   wherein the plurality of wiring layers of the wiring substrate includes:
      a first wiring layer which is nearest to the lower surface among the plurality of wiring layers, and which is provided with a plurality of land patterns; and
      a second wiring layer which is next nearest to the lower surface after the first wiring layer,
   wherein a first power supply potential pattern capable of supplying a first power supply potential to the first analog circuit and a first reference potential pattern capable of supplying a first reference potential to the first analog circuit are electrically connected with the first analog circuit,
   wherein one of the first power supply potential pattern and the first reference potential pattern is provided in the first wiring layer,
   wherein another of the first power supply potential pattern and the first reference potential pattern is provided in the second wiring layer, and
   wherein the first power supply potential pattern and the first reference potential pattern extend in a same direction as each other while mutually overlapping with each other.

2. The semiconductor device according to claim 1,
   wherein a first pattern formed in the first wiring layer among the first power supply potential pattern and the first reference potential pattern is configured to have a planar shape along an outer edge of a land pattern adjacent to the first pattern among the plurality of land patterns, and include a plurality of first wide parts with a first width in a first direction crossing with a direction in which the first pattern extends, and a plurality of first narrow parts with a width smaller than the first width in the first direction, wherein the plurality of first wide parts and the plurality of first narrow parts are alternately arranged in the direction in which the first pattern extends, wherein the first width is larger than a separation distance between adjacent land patterns via the first pattern in the first direction, and wherein the plurality of first narrow parts and the plurality of first wide parts overlap with a second pattern formed in the second wiring layer among the first power supply potential pattern and the first reference potential pattern.

3. The semiconductor device according to claim 2, wherein the second pattern formed in the second wiring layer among the first power supply potential pattern and the first reference potential pattern is configured to be formed to imitate a shape of the first pattern formed in the first wiring layer in transparent plan view, and include a plurality of second wide parts with the first width in a second direction crossing with a direction in which the second pattern extends, and a plurality of second narrow parts with a width smaller than the first width, wherein the plurality of second wide parts and the plurality of second narrow parts are alternately arranged in the direction in which the second pattern extends, and wherein the plurality of first narrow parts and the plurality of second narrow parts mutually overlap, and the plurality of first wide parts and the plurality of second wide parts mutually overlap.

4. The semiconductor device according to claim 2, wherein the plurality of land patterns is arranged at equal intervals, and wherein the first width is larger than a center-to-center distance between adjacent land patterns via the first pattern in the first direction among the plurality of land patterns.

5. The semiconductor device according to claim 4, wherein some of the plurality of land patterns are at positions surrounded by the first pattern.

6. The semiconductor device according to claim 2, wherein the plurality of land patterns is arranged at equal intervals, and the first width is smaller than a center-to-center distance between adjacent land patterns via the first pattern in the first direction among the plurality of land patterns.

7. The semiconductor device according to claim 2, wherein a first center-to-center distance between land patterns adjacent to each other via the first pattern among the plurality of land patterns is longer than a second center-to-center distance between land patterns adjacent to each other in the direction in which the first pattern extends, and a minimum width of the plurality of first narrow parts is larger than the second center-to-center distance.

8. The semiconductor device according to claim 1, wherein the wiring substrate includes a second reference potential pattern capable of supplying a second reference potential to a first circuit other than the first analog circuit, wherein the plurality of wiring layers in the wiring substrate further includes a third wiring layer which is next nearest to the lower surface after the second wiring layer, and wherein the second reference potential pattern is provided in the third wiring layer, and overlaps with the first power supply potential pattern and the first reference potential pattern.

9. The semiconductor device according to claim 8, wherein the first power supply potential pattern, the first reference potential pattern and the second reference potential pattern extend in the same direction as one another while mutually overlapping with one another.

10. The semiconductor device according to claim 9, wherein the first pattern formed in the first wiring layer among the first power supply potential pattern and the first reference potential pattern is configured to have a planar shape along an outer edge of a land pattern adjacent to the first pattern among the plurality of land patterns, and include a plurality of first wide parts with a first width in a first direction crossing with a direction in which the first pattern extends, and a plurality of first narrow parts with a width smaller than the first width in the first direction, wherein the plurality of first wide parts and the plurality of first narrow parts are alternately arranged in the direction in which the first pattern extends, wherein the first width is larger than a separation distance between adjacent land patterns via the first pattern in the first direction, and wherein the plurality of first narrow parts and the plurality of first wide parts overlap with a second pattern formed in the second wiring layer among the first power supply potential pattern and the first reference potential pattern, and overlap with the second reference potential pattern formed in the third wiring layer.

11. The semiconductor device according to claim 10, wherein the second pattern formed in the second wiring layer among the first power supply potential pattern and the first reference potential pattern is configured to being formed to imitate a shape of the first pattern formed in the first wiring layer in transparent plan view, and include a plurality of second wide parts with the first width in a second direction crossing with a direction in which the second pattern extends, and a plurality of second narrow parts with a width smaller than the first width, wherein the plurality of second wide parts and the plurality of second narrow parts are alternately arranged in the direction in which the second pattern extends, and wherein the plurality of first narrow parts and the plurality of second narrow parts mutually overlap, the plurality of first wide parts and the plurality of second wide parts mutually overlap, and the plurality of first narrow parts, the plurality of second narrow parts, the plurality of first wide parts, and the plurality of second wide parts overlap with the second reference potential pattern formed in the third wiring layer in transparent plan view.

12. The semiconductor device according to claim 1, wherein a third power supply potential pattern capable of supplying the first power supply potential to the first analog circuit and a third reference potential pattern capable of supplying the first reference potential to the first analog circuit are further electrically connected with the first analog circuit, wherein the third power supply potential pattern and the third reference potential pattern are formed in a same wiring layer as each other among the plurality of wiring layers, wherein the third power supply potential pattern and the third reference potential pattern extend in a same direction as each other while being adjacent to each other in plan view, and wherein in assumption that a path distance of a first power supply potential supplying path from the respective bump electrode of the semiconductor chip to the respective land pattern of the wiring substrate, which includes the first power supply potential pattern, is assumed as a first path distance, in assumption that a path distance of a first reference potential supplying path from the respective bump electrode of the semiconductor chip to the respective land pattern of the wiring substrate, which includes the first reference potential pattern, is assumed as a second path distance, in assumption that a path distance of a third power supply potential supplying path from the respective bump electrode of the semiconductor chip to the respective land pattern of the wiring substrate, which includes the third power supply potential pattern, is assumed as a third path distance, and in assumption that a path distance of a third reference potential supply path from the respective bump electrode of the semiconductor chip to the respective land pattern of the wiring substrate, which includes the third reference potential pattern, is assumed as a fourth path distance, the first path distance is longer than each of the third path distance and the fourth path distance, and the second path distance is longer than each of the third path distance and the fourth path distance.

13. The semiconductor device according to claim 12, wherein the wiring substrate includes a second reference potential pattern capable of supplying a second reference potential to a first circuit other than the first analog circuit, and wherein the second reference potential pattern is formed in a wiring layer adjacent to a wiring layer in which the third power supply potential pattern and the third reference potential pattern are formed among the plurality of wiring layers in the wiring substrate, and overlaps with the third power supply potential pattern and the third reference potential pattern.

14. The semiconductor device according to claim 2, wherein the first analog circuit is electrically connected with a fourth power supply potential pattern capable of supplying the first power supply potential to the first analog circuit and a fourth reference potential pattern capable of supplying the first reference potential to the first analog circuit, wherein one of the fourth power supply potential pattern and the fourth reference potential pattern is provided in the first wiring layer, wherein another of the fourth power supply potential pattern and the fourth reference potential pattern is provided in the second wiring layer, wherein the fourth power supply potential pattern and the fourth reference potential pattern extend in the same direction while mutually overlapping in transparent plan view, wherein a third pattern formed in the first wiring layer among the fourth power supply potential pattern and the fourth reference potential pattern extends with a third width, wherein the third width is smaller than a separation distance between adjacent land patterns via the third pattern in a third direction crossing with a direction in which the third pattern extends, and wherein in assumption that a path distance of a first power supply potential supplying path from the respective bump electrode of the semiconductor chip to the respective land pattern of the wiring substrate, which includes the first power supply potential pattern, is assumed as a first path distance, in assumption that a path distance of a first reference potential supply path from the respective bump electrode of the semiconductor chip to the respective land pattern of the wiring substrate, which includes the first reference potential pattern, is assumed as a second path distance, in assumption that a path distance of a fourth power supply potential supplying path from the respective bump electrode of the semiconductor chip to the respective land pattern of the wiring substrate, which includes the fourth power supply potential pattern, is assumed as a fifth path distance, and in assumption that a path distance of a fourth reference potential supply path from the respective bump electrode of the semiconductor chip to the respective land pattern of the wiring substrate, which includes the fourth reference potential pattern, is assumed as a sixth path distance, the first path distance is longer than each of the fifth path distance and the sixth path distance, and the second path distance is longer than each of the fifth path distance and the sixth path distance.

15. The semiconductor device according to claim 2, wherein a separation distance between the first pattern and a land pattern adjacent to the first pattern is longer than an interlayer distance between the first wiring layer and the second wiring layer.

16. The semiconductor device according to claim 1, wherein the first analog circuit is further electrically connected with a first signal pattern capable of transmitting an electric signal to the first analog circuit, and wherein each of a width of the first power supply potential pattern and a width of the first reference potential pattern is larger than a width of the first signal pattern.

17. The semiconductor device according to claim 1, wherein each of the width of the first power supply potential pattern and the width of the first reference potential pattern is larger than each of a thickness of the first power supply potential pattern and a thickness of the first reference potential pattern.

* * * * *